United States Patent
Cho et al.

(10) Patent No.: US 11,901,291 B2
(45) Date of Patent: Feb. 13, 2024

(54) SEMICONDUCTOR DEVICES INCLUDING LOWER ELECTRODES INCLUDING INNER PROTECTIVE LAYER AND OUTER PROTECTIVE LAYER

(71) Applicant: Samsung Electronics Co., Ltd., Suwon-si (KR)

(72) Inventors: Cheoljin Cho, Hwaseong-si (KR); Jungmin Park, Seoul (KR); Hanjin Lim, Seoul (KR); Jaehyoung Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 17/235,369

(22) Filed: Apr. 20, 2021

(65) Prior Publication Data
US 2022/0084943 A1    Mar. 17, 2022

(30) Foreign Application Priority Data
Sep. 17, 2020   (KR) .......................... 10-2020-0119546

(51) Int. Cl.
*H01L 23/528* (2006.01)
*H01L 49/02* (2006.01)

(52) U.S. Cl.
CPC .......... *H01L 23/5283* (2013.01); *H01L 28/60* (2013.01); *H01L 28/75* (2013.01); *H01L 28/90* (2013.01)

(58) Field of Classification Search
CPC ................................ H01L 28/90; H01L 28/75
See application file for complete search history.

(56) References Cited

U.S. PATENT DOCUMENTS

| | | |
|---|---|---|
| 7,655,519 B2 | 2/2010 | Chung et al. |
| 7,709,342 B2 * | 5/2010 | Kim ........................ H01L 28/91 |
| | | 257/E21.651 |
| 7,915,135 B2 | 3/2011 | Wang et al. |
| 8,343,844 B2 | 1/2013 | Kim et al. |
| 9,418,999 B2 | 8/2016 | Wu et al. |
| 9,773,861 B2 | 9/2017 | Lee et al. |
| 10,355,073 B2 | 7/2019 | Lee et al. |

(Continued)

FOREIGN PATENT DOCUMENTS

| | | |
|---|---|---|
| KR | 100673895 B1 | 1/2007 |
| KR | 20080055215 A | 6/2008 |

(Continued)

*Primary Examiner* — Farun Lu
(74) *Attorney, Agent, or Firm* — Myers Bigel, P.A.

(57) ABSTRACT

A semiconductor device includes a landing pad on a substrate, a lower electrode on the landing pad, the lower electrode including an outer protective layer, a conductive layer between opposing sidewalls of the outer protective layer, and an inner protective layer between opposing sidewalls of the conductive layer, a first supporter pattern on a side surface of the lower electrode, the first supporter pattern including a supporter hole, a dielectric layer on a surface of each of the lower electrode and the first supporter pattern, and an upper electrode on the dielectric layer. The outer protective layer includes titanium oxide, the conductive layer includes titanium nitride, and the inner protective layer includes titanium silicon nitride. In a horizontal cross-sectional view, the outer protective layer has an arc shape that extends between the dielectric layer and the conductive layer.

16 Claims, 34 Drawing Sheets

(56) References Cited

U.S. PATENT DOCUMENTS

| | | | |
|---|---|---|---|
| 2004/0108536 A1* | 6/2004 | Lee | H01L 27/10817 |
| | | | 257/E21.59 |
| 2009/0072349 A1 | 3/2009 | Tak et al. | |
| 2014/0015097 A1* | 1/2014 | Greeley | H01L 28/75 |
| | | | 257/532 |
| 2017/0179219 A1 | 6/2017 | Shizaka et al. | |
| 2018/0019300 A1* | 1/2018 | Lee | H01L 27/10852 |

FOREIGN PATENT DOCUMENTS

| | | |
|---|---|---|
| KR | 100951557 B1 | 4/2010 |
| KR | 101946124 B1 | 2/2019 |

\* cited by examiner

SEMICONDUCTOR DEVICES INCLUDING LOWER ELECTRODES INCLUDING INNER PROTECTIVE LAYER AND OUTER PROTECTIVE LAYER

CROSS-REFERENCE TO THE RELATED APPLICATION

This application claims priority from Korean Patent Application No. 10-2020-0119546, filed on Sep. 17, 2020, in the Korean Intellectual Property Office, the disclosure of which is incorporated herein by reference in its entirety.

BACKGROUND

1. Field

The present disclosure relates to semiconductor devices including lower electrodes.

2. Description of the Related Art

As demand for highly integrating and miniaturizing semiconductor devices increases, a size of a capacitor of each semiconductor device may be progressively miniaturized. Therefore, a lower electrode having a high aspect ratio may be used so that a capacitor disposed in a fine pattern secures a certain capacitance. The lower electrode having the high aspect ratio may be at risk, however, of collapsing during a manufacturing process.

SUMMARY

Example embodiments of the disclosure provide a semiconductor device including a lower electrode including an inner protective layer and an outer protective layer.

A semiconductor device in accordance with an embodiment of the disclosure may include a landing pad on a substrate, a lower electrode on the landing pad, the lower electrode including an outer protective layer, a conductive layer between opposing sidewalls of the outer protective layer, and an inner protective layer between opposing sidewalls of the conductive layer, a first supporter pattern on a side surface of the lower electrode, the first supporter pattern including a supporter hole, a dielectric layer on a surface of each of the lower electrode and the first supporter pattern, and an upper electrode on the dielectric layer. The outer protective layer may include titanium oxide, the conductive layer may include titanium nitride, and the inner protective layer may include titanium silicon nitride. In a horizontal cross-sectional view, the outer protective layer may have an arc shape that extends between the dielectric layer and the conductive layer.

A semiconductor device in accordance with an embodiment of the disclosure may include a landing pad on a substrate, a lower electrode structure including a first lower electrode on the landing pad and a second lower electrode on the first lower electrode, a buried layer between the first lower electrode and the second lower electrode, a first supporter pattern on a side surface of the lower electrode structure, the first supporter pattern including a supporter hole, a dielectric layer on a surface of each of the lower electrode structure and the first supporter pattern, and an upper electrode on the dielectric layer. The first lower electrode may include a first outer protective layer, a first conductive layer between opposing sidewalls of the first outer protective layer, and a first inner protective layer between opposing sidewalls of the first conductive layer. The second lower electrode may include a second outer protective layer, a second conductive layer between opposing sidewalls of the second outer protective layer, and a second inner protective layer between opposing sidewalls of the second conductive layer. Each of the first outer protective layer and the second outer protective layer may include titanium oxide, each of the first conductive layer and the second conductive layer may include titanium nitride, and each of the first inner protective layer and the second inner protective layer may include titanium silicon nitride.

A semiconductor device in accordance with an embodiment of the disclosure may include a landing pad on a substrate, a lower electrode on the landing pad, the lower electrode including an outer protective layer, a conductive layer having a U-shaped cross-sectional surface between opposing sidewalls of the outer protective layer, and an inner protective layer between opposing sidewalls of the U-shaped cross-sectional surface of the conductive layer, a first supporter pattern on a side surface of the lower electrode, the first supporter pattern including a supporter hole, a first metal layer between the conductive layer and the first supporter pattern, the first metal layer overlapping the outer protective layer in a vertical direction and including an upper surface at a lower level than an upper surface of the first supporter pattern, a dielectric layer on a surface of each of the lower electrode and the first supporter pattern, and an upper electrode on the dielectric layer. The outer protective layer may include titanium oxide, the conductive layer may include titanium nitride, and the inner protective layer may include titanium silicon nitride. In a horizontal cross-sectional view, the outer protective layer and the first metal layer may each have an arc shape and may together surround the conductive layer.

DETAILED DESCRIPTION

Figure 1:
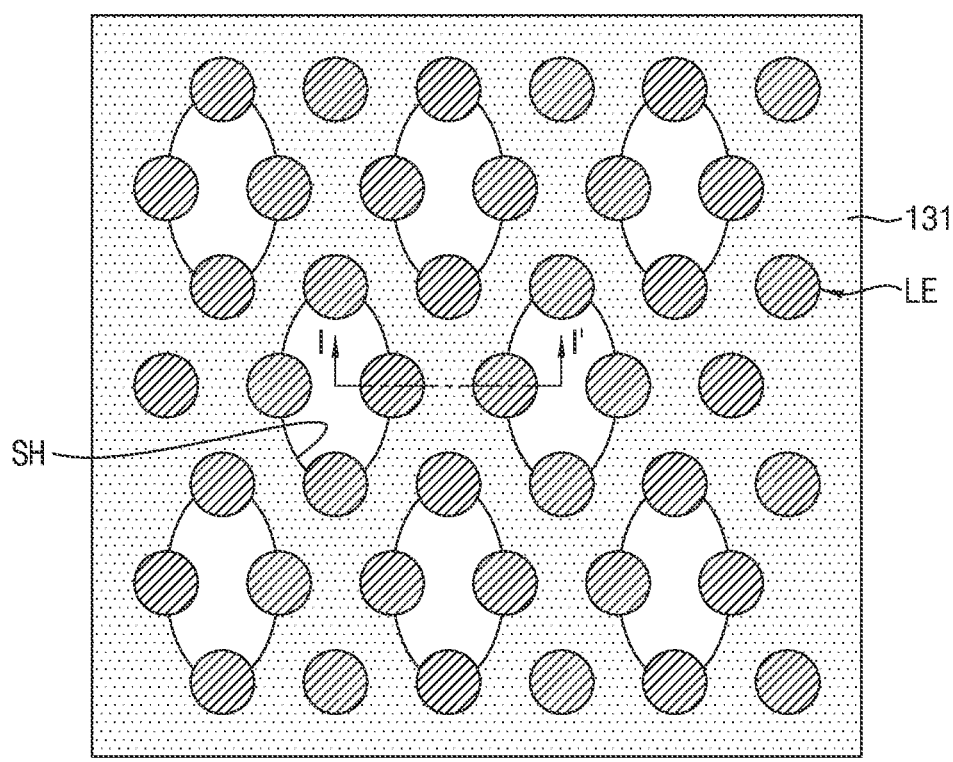
FIG. 1 is a layout of a semiconductor device 100 according to an example embodiment of the inventive concepts.
Figure 2:
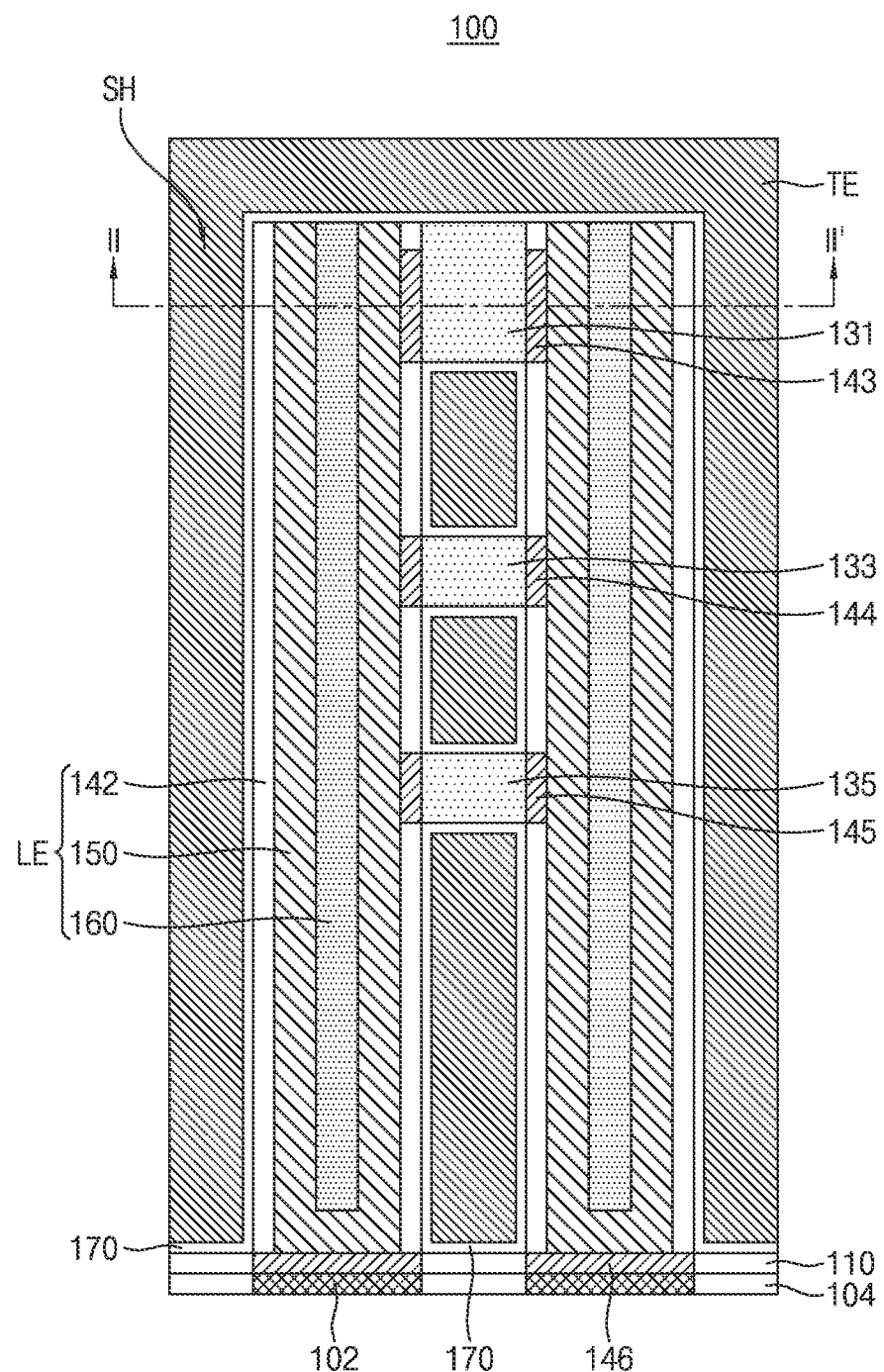
FIG. 2 is a vertical cross-sectional view taken along line I-I' of the semiconductor device illustrated in FIG. 1.

FIG. 1 is a layout of a semiconductor device 100 according to an example embodiment of the inventive concepts. FIG. 2 is a vertical cross-sectional view taken along line I-I' of the semiconductor device illustrated in FIG. 1.

Referring to FIGS. 1 and 2, the semiconductor device 100 may include a landing pad 102, a pad insulation layer 104, an etch stop layer 110, a first supporter pattern 131, a second supporter pattern 133, a third supporter pattern 135, a lower electrode LE, a dielectric layer 170, and an upper electrode TE.

A plurality of landing pads 102 may be buried into the pad insulation layer 104. Upper surfaces of the plurality of landing pads 102 may be disposed at the same level as (i.e., may be coplanar with) an upper surface of the pad insulation layer 104. However, the disclosure is not limited thereto, and in an embodiment, the upper surfaces of the plurality of landing pads 102 may be disposed at a lower level than the upper surface of the pad insulation layer 104. The landing pad 102 may be electrically connected to the lower electrode LE. The pad insulation layer 104 may electrically insulate the plurality of landing pads 102 from each other. The plurality of landing pads 102 may include a conductive material, and the pad insulation layer 104 may include an insulating material. The plurality of landing pads 102 and the pad insulation layer 104, as described below, may be disposed on a substrate (e.g., a substrate 10 (FIG. 37)).

The etch stop layer 110 may be disposed on the pad insulation layer 104. The etch stop layer 110 may impede/prevent an etchant from flowing down with respect to the lower electrode LE in a wet etching process, thereby protecting/preventing the pad insulation layer 104 from being etched.

The first supporter pattern 131, the second supporter pattern 133, and the third supporter pattern 135 may be disposed between a plurality of lower electrodes LE. The first supporter pattern 131, the second supporter pattern 133, and the third supporter pattern 135 may be spaced apart from one another in a vertical direction. The first supporter pattern 131 may be disposed on the second supporter pattern 133, and the second supporter pattern 133 may be disposed on the third supporter pattern 135. An upper surface of the first supporter pattern 131 may be coplanar with an upper surface of the lower electrode LE. The first supporter pattern 131, the second supporter pattern 133, and the third supporter pattern 135 may connect and support the plurality of lower electrodes LE.

As illustrated in FIG. 1, the first supporter pattern 131 may include a plurality of supporter holes SH which are arranged at certain intervals. The second supporter pattern 133 and the third supporter pattern 135 may include a plurality of openings corresponding to the plurality of supporter holes SH of the first supporter pattern 131. For example, the openings of the second supporter pattern 133 and the third supporter pattern 135 may be aligned in a direction vertical to the supporter holes SH of the first supporter pattern 131.

The plurality of lower electrodes LE may be respectively disposed on the plurality of landing pads 102 and may be electrically connected to the plurality of landing pads 102. Referring to FIG. 1, in a plan view seen from above, the plurality of lower electrodes LE may be horizontally arranged at certain intervals. In an embodiment, the plurality of lower electrodes LE may have a honeycomb structure in which the plurality of lower electrodes LE is disposed at a center and vertexes of a hexagon. In an embodiment, each of the plurality of lower electrodes LE may have a pillar shape, but is not limited thereto.

Referring further to FIG. 2, the lower electrode LE may include an outer protective layer 142, a conductive layer 150, and an inner protective layer 160. The outer protective layer 142 may be disposed along a perimeter of the lower electrode LE, and the conductive layer 150 may be disposed along an inner wall of the outer protective layer 142 in (e.g., between opposing sidewalls of) the outer protective layer 142. The conductive layer 150 may include a cross-sectional surface having a U-shape. The inner protective layer 160 may be inside (e.g., filled into or otherwise between opposing sidewalls of) the conductive layer 150. A bottom surface of the inner protective layer 160 may be disposed at a higher level than a bottom surface of the conductive layer 150.

In an embodiment, the outer protective layer 142 may include titanium oxide, and the conductive layer 150 may include titanium (Ti). The outer protective layer 142 may prevent and/or decrease the oxidation or non-uniform oxidation of the conductive layer 150. In an embodiment, the inner protective layer 160 may include titanium silicon nitride (TiSiN). The inner protective layer 160 may support the conductive layer 150. The lower electrode LE according to the disclosure may include the outer protective layer 142 and the inner protective layer 160 which are respectively disposed outward and inward from the conductive layer 150, and thus, the bending or collapsing of the lower electrode LE may be prevented and/or reduced.

The lower electrode LE may further include a first metal layer 143, a second metal layer 144, a third metal layer 145, and a lower metal layer 146, which partially cover a side surface and a bottom surface of the conductive layer 150. The lower metal layer 146 may be at least as wide as the bottom surface of the conductive layer 150. The first metal layer 143, the second metal layer 144, and the third metal layer 145 may be disposed between adjacent portions of the outer protective layer 142. For example, the first metal layer 143, the second metal layer 144, and the third metal layer 145 may overlap the outer protective layer 142 in a vertical direction. In detail, the first metal layer 143 may be disposed between the first supporter pattern 131 and the conductive layer 150, the second metal layer 144 may be disposed between the second supporter pattern 133 and the conductive layer 150, and the third metal layer 145 may be disposed between the third supporter pattern 135 and the conductive layer 150.

In an embodiment, a vertical length of the first metal layer 143 may be less than that of the first supporter pattern 131. For example, a bottom surface of the first metal layer 143 may be coplanar with a bottom surface of the first supporter pattern 131, and an upper surface of the first metal layer 143 may be disposed at a lower level than an upper surface of the first supporter pattern 131. The outer protective layer 142 may be disposed on the first metal layer 143 (e.g., on top and bottom surfaces thereof). In an embodiment, vertical lengths of the second metal layer 144 and the third metal layer 145 may be the same as those of the second supporter pattern 133 and the third supporter pattern 135, respectively. However, the disclosure is not limited thereto.

The lower metal layer 146 may be disposed between the landing pad 102 and the conductive layer 150. In an embodiment, a horizontal width of the lower metal layer 146 may be greater than that of the conductive layer 150. An upper surface of the lower metal layer 146 may contact the conductive layer 150 and the outer protective layer 142.

The dielectric layer 170 may be disposed between the lower electrode LE and the upper electrode TE. For example, the dielectric layer 170 may be conformally disposed on a surface of each of the etch stop layer 110, the lower electrode LE, the first supporter pattern 131, the second supporter pattern 133, and the third supporter pattern 135.

The upper electrode TE may be disposed on the dielectric layer 170. The upper electrode TE may include metal, such as Ti, tungsten (W), nickel (Ni), or cobalt (Co), or metal nitride such as titanium nitride (TiN), TiSiN, titanium aluminum nitride (TiAlN), tantalum nitride (TaN), tantalum silicon nitride (TaSiN), or tungsten nitride (WN). In an embodiment, the upper electrode TE may include TiN.

Figure 3:
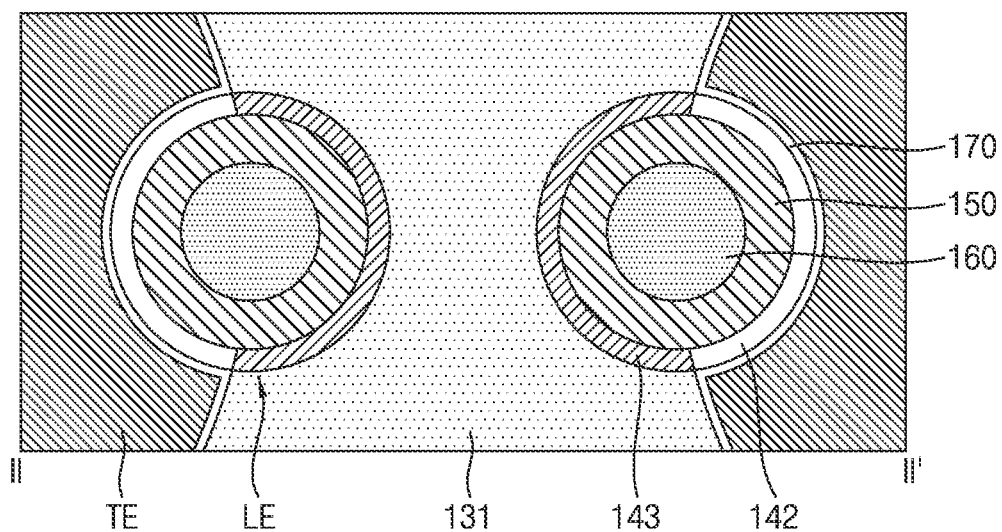
FIG. 3 is a horizontal cross-sectional view taken along line II-II' of the semiconductor device illustrated in FIG. 2.

FIG. 3 is a horizontal cross-sectional view taken along line II-II' of the semiconductor device illustrated in FIG. 2. Referring to FIG. 3, in the horizontal cross-sectional view, the lower electrode LE may be surrounded by the first supporter pattern 131 and the upper electrode TE. The first metal layer 143 may be disposed between the conductive layer 150 and the first supporter pattern 131, and the outer protective layer 142 may be disposed between the conductive layer 150 and the upper electrode TE. In other words, the outer protective layer 142 and the first metal layer 143 may each have an arc shape which extends in a circumferential direction and may together (i.e., collectively) surround the conductive layer 150. An outer surface of the conductive layer 150 may contact an inner surface of the outer protective layer 142 and an inner surface of the first metal layer 143. A circumferential direction cross-sectional surface of the outer protective layer 142 may contact a circumferential direction cross-sectional surface of the first metal layer 143. The dielectric layer 170 may be disposed between the outer protective layer 142 and the upper electrode TE and between the first supporter pattern 131 and the upper electrode TE. In FIG. 3, it is illustrated that a diameter-direction thickness of the outer protective layer 142 is the same as a diameter-direction thickness of the first metal layer 143, but the disclosure is not limited thereto. In an embodiment, the diameter-direction thickness of the outer protective layer 142 may be greater than the diameter-direction thickness of the first metal layer 143.

FIGS. 4 to 10 are cross-sectional views illustrating, in process order, a method of manufacturing a semiconductor device according to an example embodiment of the inventive concepts.

Figure 4:
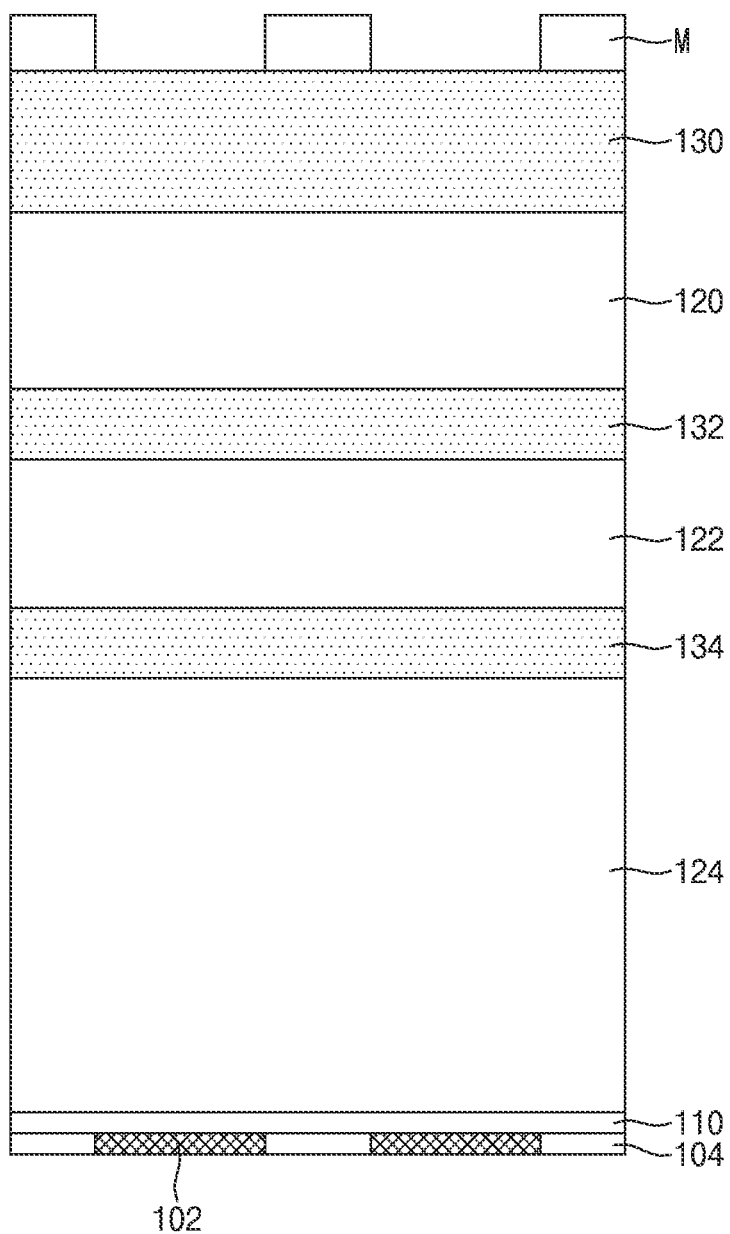
FIGS. 4 to 10 are cross-sectional views illustrating, in process order, a method of manufacturing a semiconductor device according to an example embodiment of the inventive concepts.

Referring to FIG. 4, a landing pad 102, a pad insulation layer 104, and an etch stop layer 110 may be provided. The pad insulation layer 104 may be disposed between a plurality of landing pads 102. The etch stop layer 110 may be formed on the plurality of landing pads 102 and the pad insulation layer 104. The landing pad 102 may include a conductive material. For example, the landing pad 102 may include a doped semiconductor material such as doped polysilicon, a metal-semiconductor compound such as tungsten silicon ($WSi_2$), metal nitride such as TiN or TaN, or metal such as Ti, W, or Ta. The pad insulation layer 104 may include silicon oxide, silicon nitride, silicon oxynitride, or a combination thereof. The etch stop layer 110 may include a material having an etch selectivity with respect to a first mold layer 120, a second mold layer 122, and a third mold layer 124. In an embodiment, the etch stop layer 110 may include silicon nitride, silicon oxynitride, or a combination thereof.

A mask layer M, a first supporter layer 130, the first mold layer 120, a second supporter layer 132, the second mold layer 122, a third supporter layer 134, and the third mold layer 124 may be formed on the etch stop layer 110. For example, the first supporter layer 130 may be disposed on the second supporter layer 132, and the second supporter layer 132 may be disposed on the third supporter layer 134. The first mold layer 120, the second mold layer 122, and the third mold layer 124 may be respectively disposed under the first supporter layer 130, the second supporter layer 132, and the third supporter layer 134.

The first mold layer 120, the second mold layer 122, and the third mold layer 124 may include a material having an etch selectivity with respect to the first supporter layer 130, the second supporter layer 132, and the third supporter layer 134. For example, the first mold layer 120, the second mold layer 122, and the third mold layer 124 may include silicon oxide, and the first supporter layer 130, the second supporter layer 132, and the third supporter layer 134 may include silicon nitride, silicon oxynitride, or a combination thereof The mask layer M may expose a portion of the first supporter layer 130. The mask layer M may define a region where the lower electrode LE is disposed. The mask layer M may include amorphous carbon or polysilicon.

Figure 5:
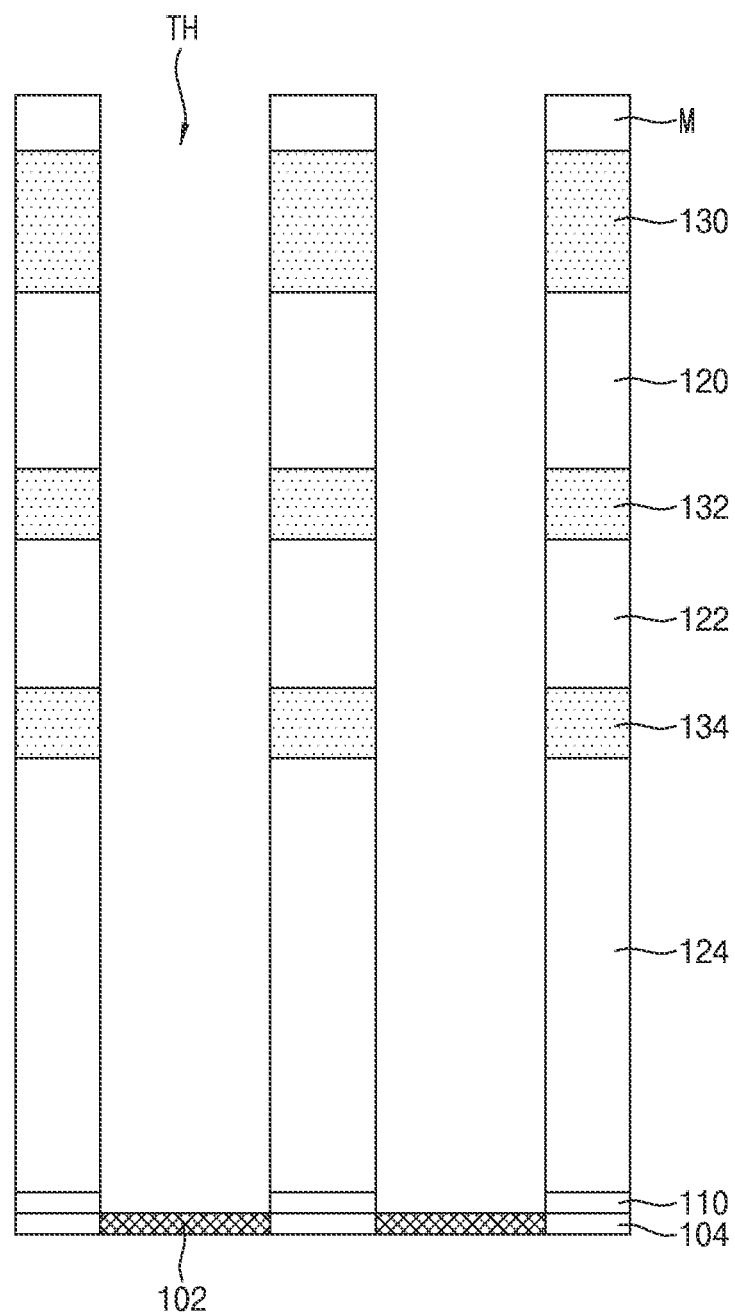

Referring to FIG. 5, a through hole TH may be formed to vertically pass through the etch stop layer 110, the first mold layer 120, the first supporter layer 130, the second mold layer 122, the second supporter layer 132, the third mold layer 124, and the third supporter layer 134.

The through hole TH may have a certain horizontal width, and in another embodiment, the through hole TH may have a tapered shape where a horizontal width thereof is narrowed in a direction from an upper portion thereof to a lower portion thereof. The through hole TH may be formed by a dry etching process using the mask layer M as an etch mask. For example, the first supporter layer 130, the first mold layer 120, the second supporter layer 132, the second mold layer 122, the third supporter layer 134, and the third mold layer 124 may be sequentially anisotropically-etched, and then, a portion of the etch stop layer 110 may be removed to expose the landing pad 102.

Figure 6:
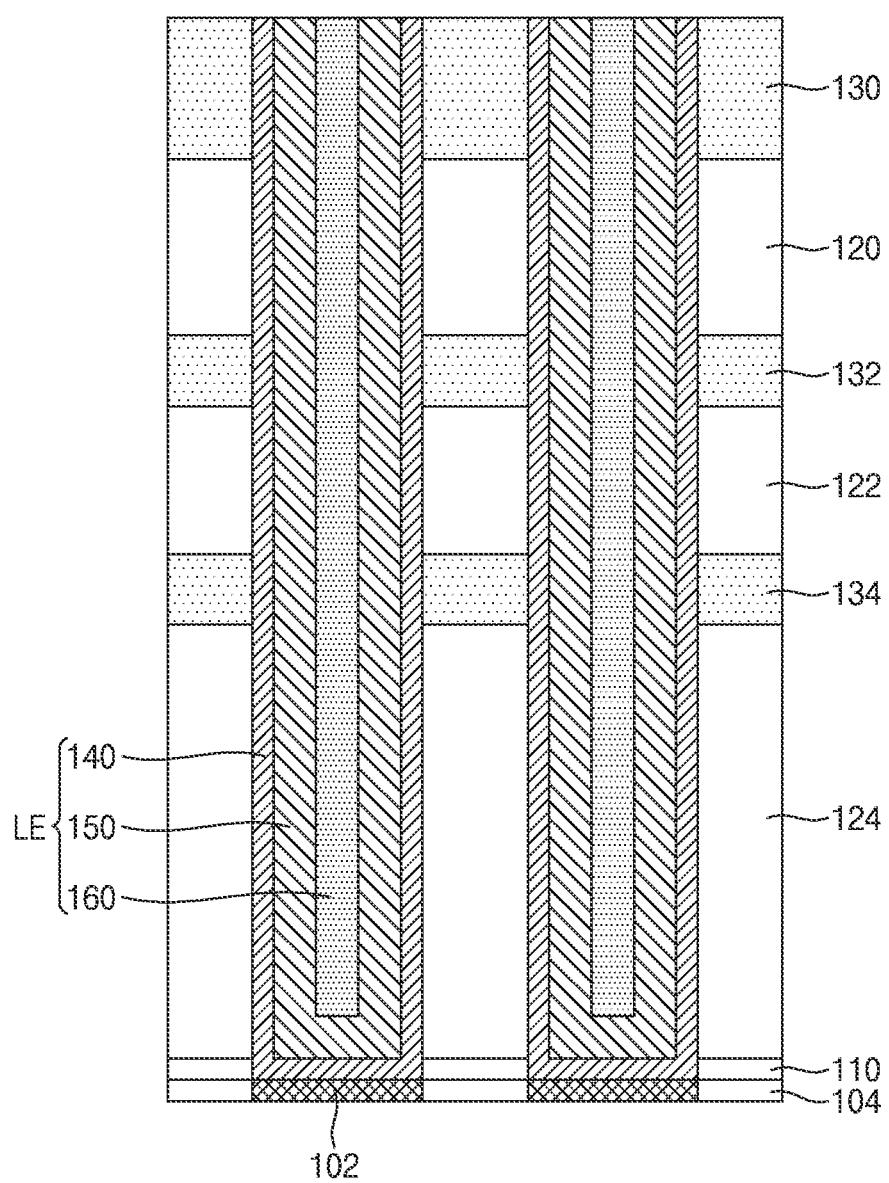

Referring to FIG. 6, a lower electrode LE may be formed in the through hole TH. The lower electrode LE may be formed by sequentially depositing a preliminary protective layer 140, a conductive layer 150, and an inner protective layer 160 on an inner portion of the through hole TH. For example, the preliminary protective layer 140, the conductive layer 150, and the inner protective layer 160 may be formed through a process such as a chemical vapor deposition (CVD) process, an atomic layer deposition (ALD) process, or a plasma enhanced ALD (PEALD) process. The preliminary protective layer 140 may be formed along an inner wall of the through hole TH and may contact the landing pad 102. The conductive layer 150 may be formed along an inner wall of the preliminary protective layer 140 and may include a U-shaped cross-sectional surface. The inner protective layer 160 may be filled into the conductive layer 150. In an embodiment, a seam extending in a vertical direction may be formed in the inner protective layer 160.

In an embodiment, the preliminary protective layer 140 may include Ti, the conductive layer 150 may include TiN, and the inner protective layer 160 may include TiSiN. After the lower electrode LE is formed, a planarization process may be performed. After the planarization process, an upper surface of the lower electrode LE may be coplanar with the first supporter layer 130, and the mask layer M may be removed.

Figure 7:
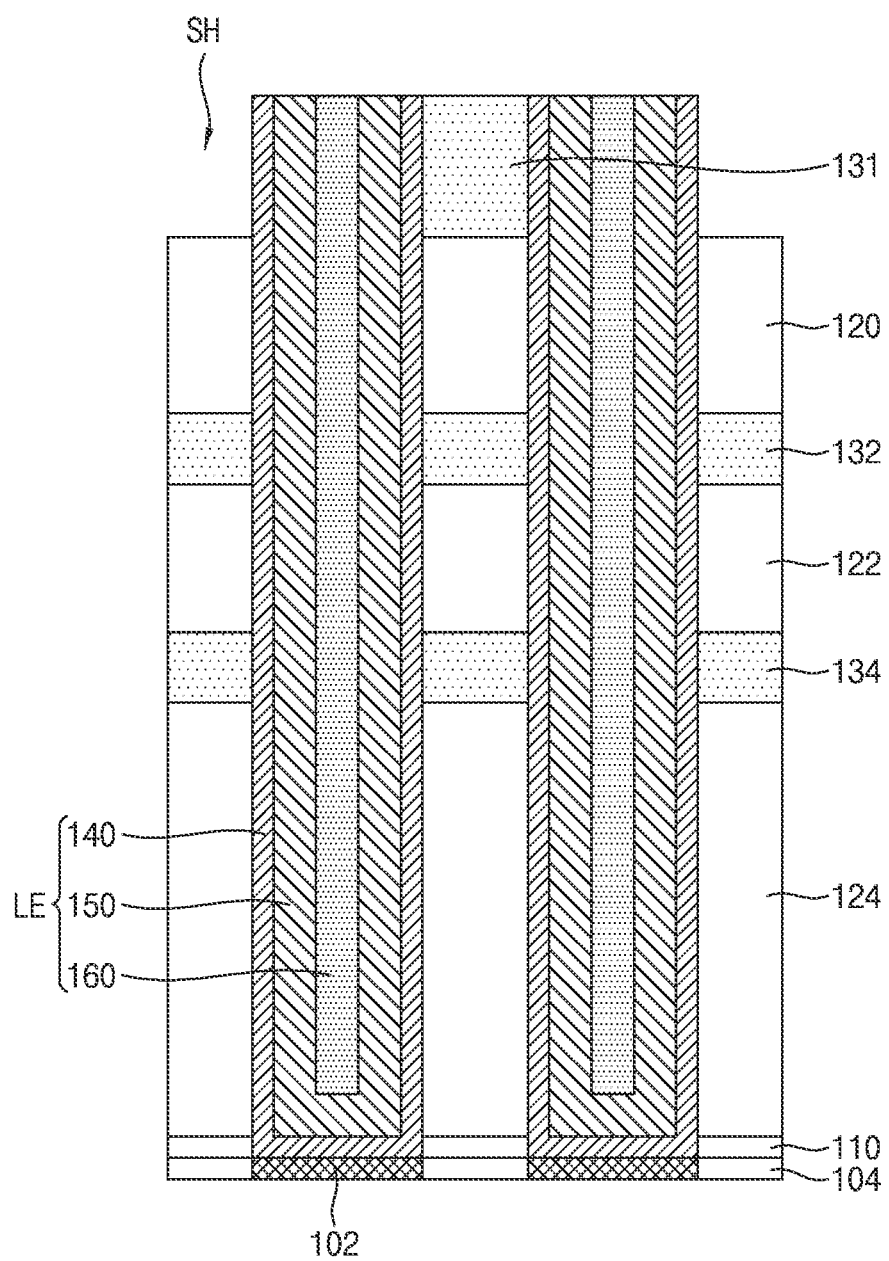

Referring to FIG. 7, the first supporter layer 130 may be partially etched by an anisotropic etching process, and thus, the first supporter pattern 131 may be formed. The first supporter pattern 131 may include a supporter hole SH. In the etching process, the lower electrode LE having an etch selectivity with respect to the first supporter pattern 131 may not be etched. However, the disclosure is not limited thereto, and in another embodiment, a portion of the lower electrode LE may be etched. The first mold layer 120 may be partially exposed by the first supporter pattern 131.

Figure 8:
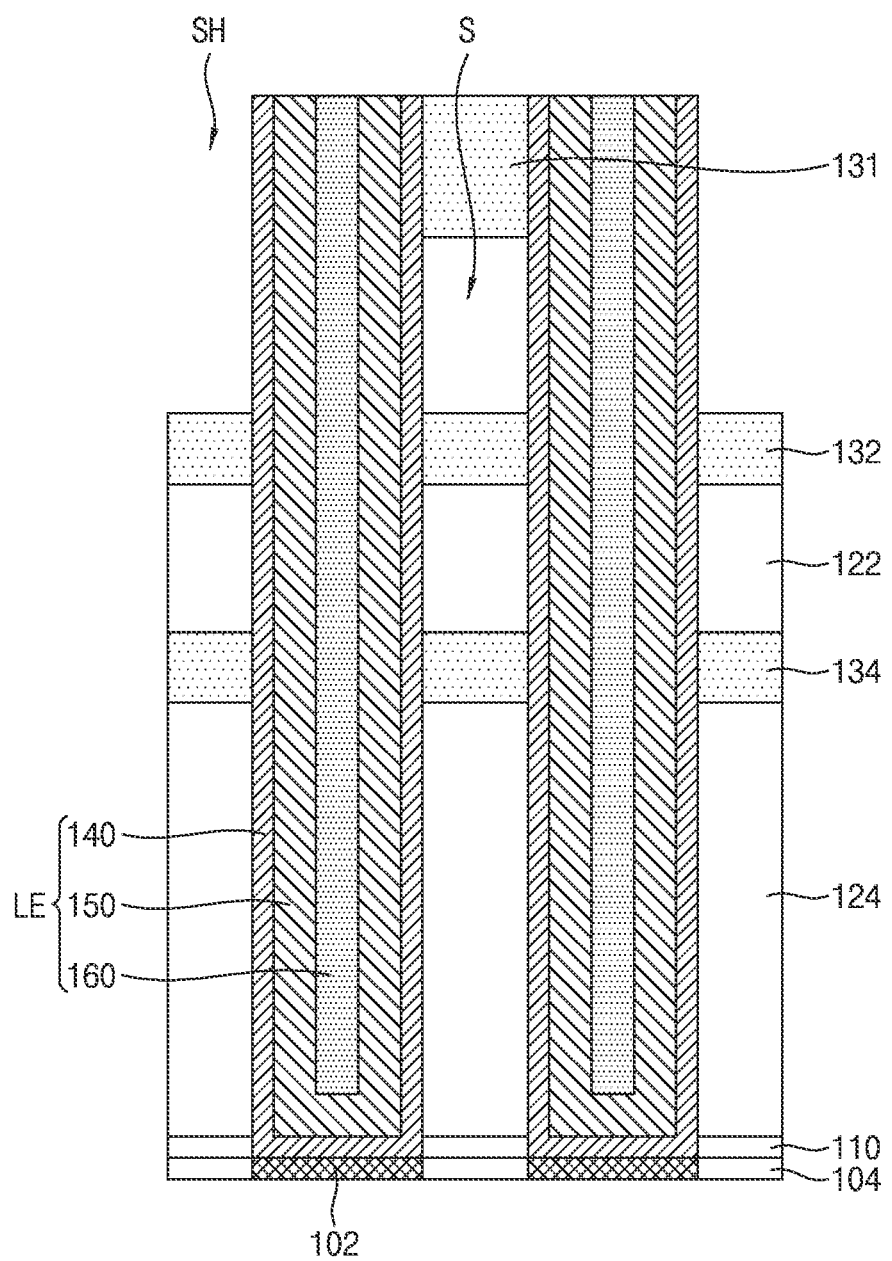

Referring to FIG. 8, the first mold layer 120 may be removed. The first mold layer 120 may be removed by an isotropic etching process such as a wet etching process. For example, when the first mold layer 120 includes silicon oxide, an etching process may be performed by using a solution including HF, NH$_4$F, and/or the like. The first mold layer 120 may be removed, and thus, the second supporter layer 132 may be exposed. In the etching process, the first supporter pattern 131 and the second supporter layer 132 each having an etch selectivity with respect to the first mold layer 120 may not be removed. An empty space S may be formed at a position from which the first mold layer 120 is removed, and a side surface of the lower electrode LE may be partially exposed.

Figure 9:
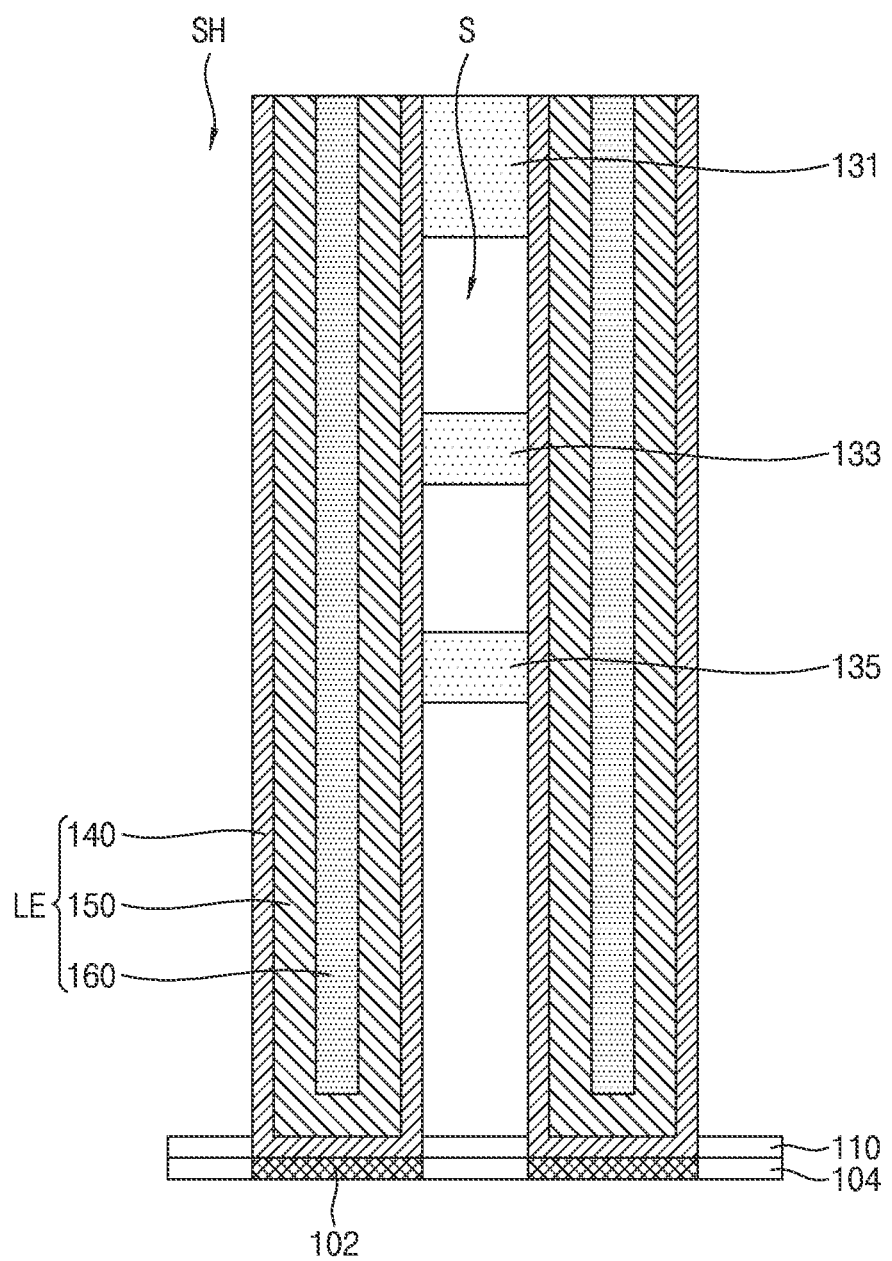

Referring to FIG. 9, the second supporter layer 132 and the third supporter layer 134 may be etched, and thus, the second supporter pattern 133 and the third supporter pattern 135 may be formed, respectively. Also, the second mold layer 122 and the third mold layer 124 may be removed. An etching process performed on the second mold layer 122, the third mold layer 124, the second supporter layer 132, and the third supporter layer 134 may be performed as a process which is the same as or similar to the description of FIGS. 7 and 8. The second supporter pattern 133 and the third supporter pattern 135 may have a pattern which is the same as or similar to the first supporter pattern 131. The first supporter pattern 131, the second supporter pattern 133, and the third supporter pattern 135 may support the lower electrode LE not to collapse. The empty space S may expose upper surfaces and bottom surfaces of the first supporter pattern 131, the second supporter pattern 133, and the third supporter pattern 135.

Figure 10:
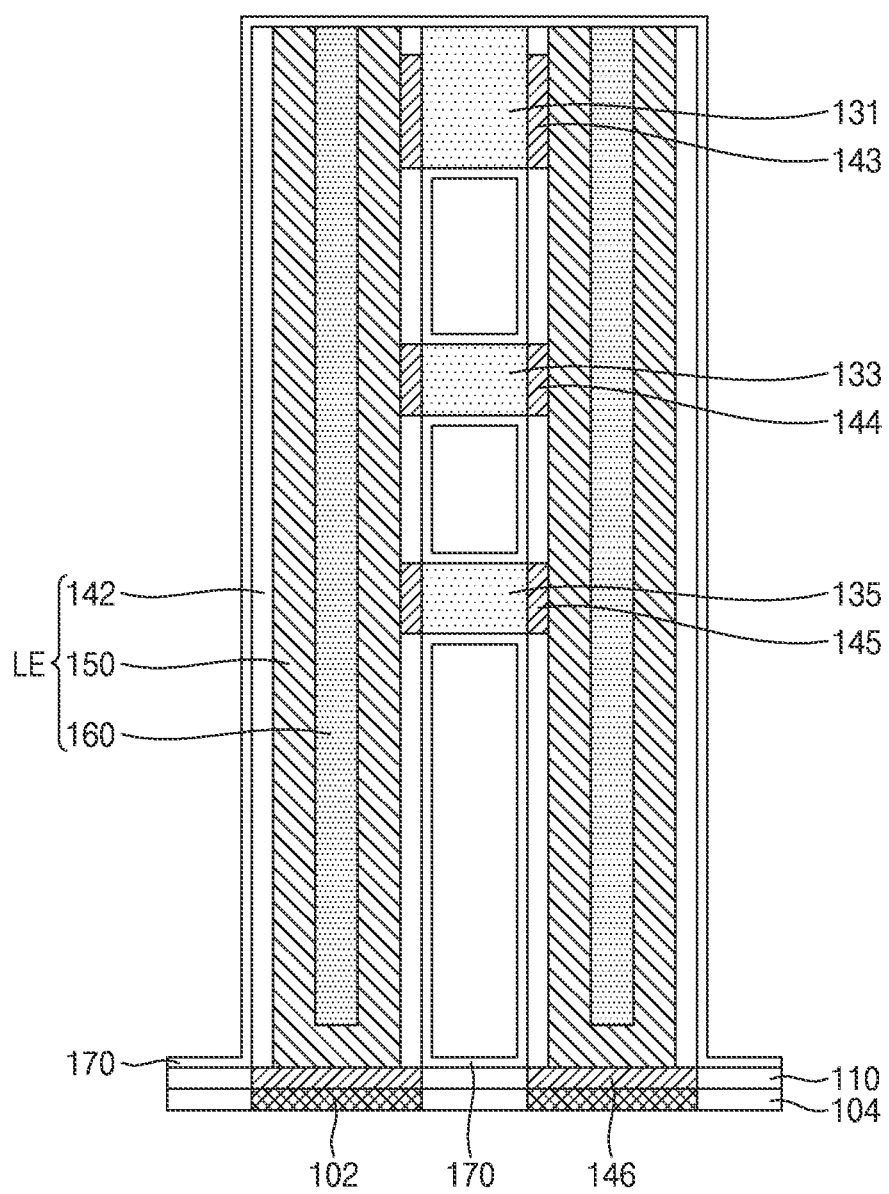

Referring to FIG. 10, an outer protective layer 142 and a dielectric layer 170 may be formed. In an embodiment, the outer protective layer 142 may be formed by oxidizing the preliminary protective layer 140 in a process of forming the dielectric layer 170. The outer protective layer 142 may include titanium oxide. In another embodiment, a process of oxidizing the preliminary protective layer 140 may be separately performed before the dielectric layer 170 is formed. For example, the process of oxidizing the preliminary protective layer 140 may use a material such as $O_2$, $O_3$, $H_2O$, an alcoholic material, an isoprene alcoholic material, or $H_2O_2$.

An unexposed portion of the preliminary protective layer 140 may not be oxidized. For example, a portion of the preliminary protective layer 140 contacting the first supporter pattern 131, the second supporter pattern 133, the third supporter pattern 135, and/or the landing pad 102 may not be oxidized. A portion, which is not oxidized and remains, of the preliminary protective layer 140 may be referred to as the first metal layer 143, the second metal layer 144, the third metal layer 145, and the lower metal layer 146. The first metal layer 143 may be disposed between the first supporter pattern 131 and the conductive layer 150, the second metal layer 144 may be disposed between the second supporter pattern 133 and the conductive layer 150, the third metal layer 145 may be disposed between the third supporter pattern 135 and the conductive layer 150, and the lower metal layer 146 may be disposed between the landing pad 102 and the conductive layer 150.

The dielectric layer 170 may be conformally formed along a surface of each of the etch stop layer 110, the lower electrode LE, the first supporter pattern 131, the second supporter pattern 133, and the third supporter pattern 135. The dielectric layer 170 may include metal oxide such as hafnium oxide ($HfO_2$), zirconium oxide ($ZrO_2$), aluminum oxide ($Al_2O_3$), lanthanum oxide ($La_2O_3$), tantalum oxide ($Ta_2O_3$), or titanium oxide ($TiO_2$), a dielectric material having a perovskite structure such as strontium titanate ($SrTiO_3$(STO)), barium titanate ($BaTiO_3$), lead zirconium titanate (PZT), or lanthanum-modified lead zirconium titanate (PLZT), or a combination thereof. The dielectric layer 170 may be formed through a process such as a CVD process or an ALD process.

Referring again to FIG. 2, an upper electrode TE may be formed on the dielectric layer 170 and may be on (e.g., may cover) the lower electrode LE, the first supporter pattern 131, the second supporter pattern 133, and the third supporter pattern 135. The upper electrode TE may be in (e.g., may fill) a space between a plurality of lower electrodes LE and spaces between the first supporter pattern 131, the second supporter pattern 133, and the third supporter pattern 135. The lower electrode LE, the dielectric layer 170, and the upper electrode TE may function as a capacitor. The upper electrode TE may include TiN. The upper electrode TE may be formed through a process such as a CVD process or an ALD process.

Figure 11:
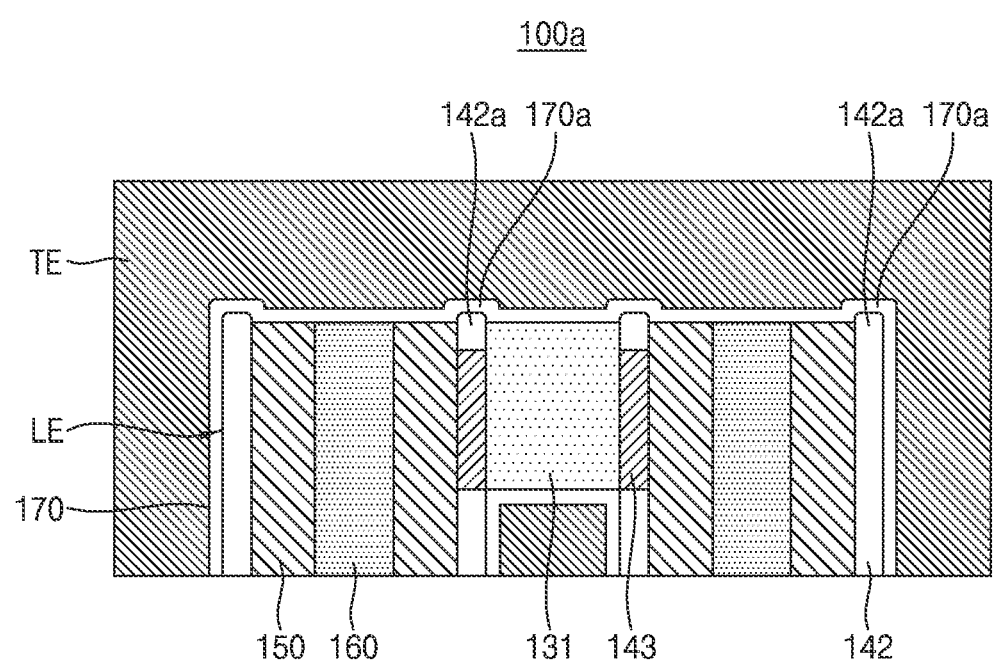
FIG. 11 is an enlarged view of a semiconductor device according to an example embodiment of the inventive concepts.

FIG. 11 is an enlarged view of a semiconductor device according to an example embodiment of the inventive concepts.

Referring to FIG. 11, the semiconductor device 100a may include an outer protective layer 142 and a dielectric layer 170. The outer protective layer 142 may be disposed outward from the conductive layer 150, and as described above, the outer protective layer 142 may be formed by oxidizing the preliminary protective layer 140. In an embodiment, based on an oxidization process, the outer protective layer 142 may include a protrusion 142a which protrudes in a vertical direction. An upper end of the protrusion 142a may be disposed at a higher level than an upper surface of each of the conductive layer 150 and an inner protective layer 160.

The dielectric layer 170 may be disposed along a surface of each of the lower electrode LE and a first supporter pattern 131. In an embodiment, the dielectric layer 170 may include a protrusion 170a corresponding to the protrusion 142a of the outer protective layer 142. For example, the protrusion 170a may cover the protrusion 142a.

Figure 12:
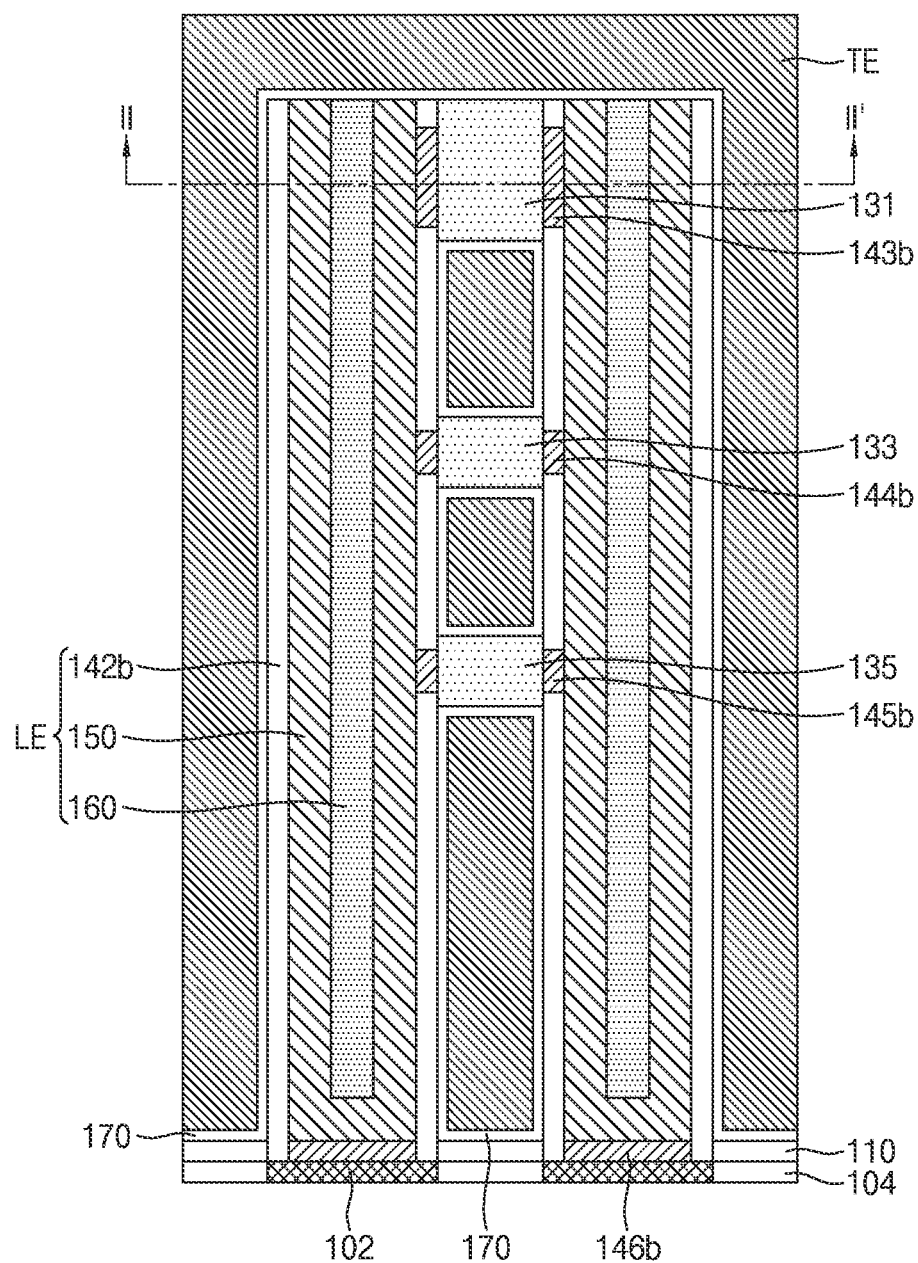
FIG. 12 is a vertical cross-sectional view of a semiconductor device according to an example embodiment of the inventive concepts.
Figure 13:
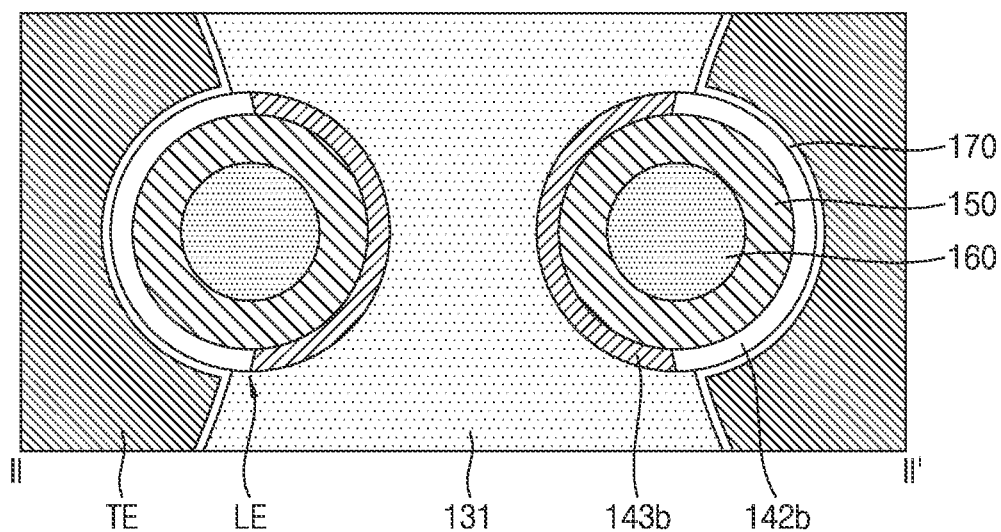
FIG. 13 is a horizontal cross-sectional view taken along line II-II' of the semiconductor device illustrated in FIG. 12.

FIG. 12 is a vertical cross-sectional view of a semiconductor device according to an example embodiment of the inventive concepts. FIG. 13 is a horizontal cross-sectional view taken along line II-II' of the semiconductor device illustrated in FIG. 12.

Referring to FIG. 12, a lower electrode LE of the semiconductor device 100b may include an outer protective layer 142b, a first metal layer 143b, a second metal layer 144b, a third metal layer 145b, and a lower metal layer 146b, which partially cover a side surface and a bottom surface of the conductive layer 150. In an embodiment, a vertical length of each of the first metal layer 143b, the second metal layer 144b, and the third metal layer 145b may be less than that of each of a first supporter pattern 131, a second supporter pattern 133, and a third supporter pattern 135. For example, a bottom surface of the first metal layer 143b may be disposed at a higher level than a bottom surface of the first supporter pattern 131. An upper surface of the second metal layer 144b may be disposed at a lower level than an upper surface of the second supporter pattern 133, and a bottom surface of the second metal layer 144b may be disposed at a higher level than a bottom surface of the second supporter pattern 133. An upper surface of the third metal layer 145b may be disposed at a lower level than an upper surface of the third supporter pattern 135, and a bottom surface of the third metal layer 145b may be disposed at a higher level than a bottom surface of the third supporter pattern 135.

In an embodiment, a horizontal width of the lower metal layer 146b may be less than that of the lower electrode LE. For example, the horizontal width of the lower metal layer 146b may be equal to that of the bottom surface of the conductive layer 150. A side surface of the lower metal layer 146b may contact a side surface of the outer protective layer 142b.

Referring to FIG. 13, in the horizontal cross-sectional view, the outer protective layer 142b and a first metal layer 143b may together surround a conductive layer 150. In an embodiment, a portion of the outer protective layer 142b may be disposed between the conductive layer 150 and the first supporter pattern 131. For example, a boundary surface between the outer protective layer 142b and the first metal layer 143b may be disposed in the first supporter pattern 131, and at least a portion of the outer protective layer 142b may contact the first supporter pattern 131.

Figure 14:
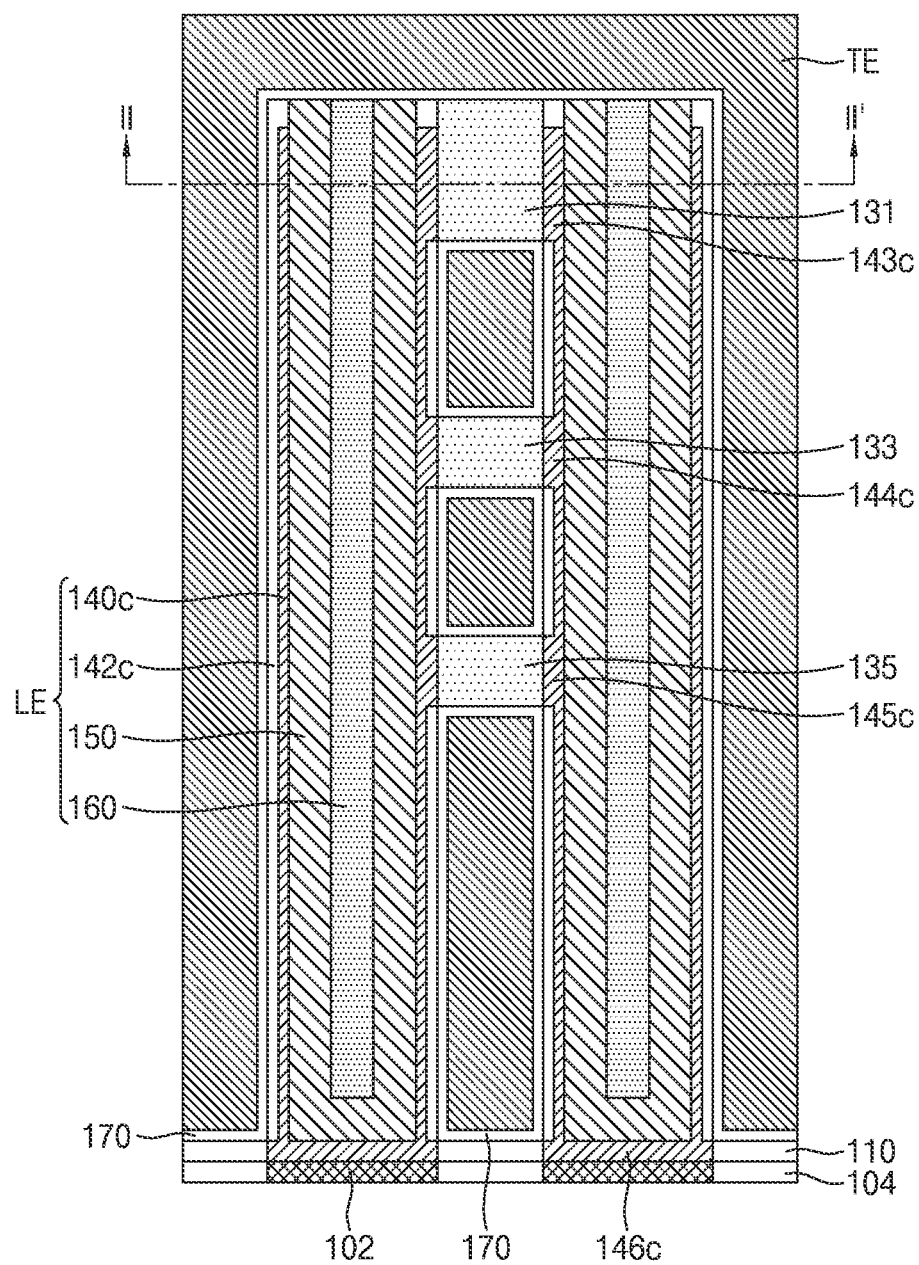
FIG. 14 is a vertical cross-sectional view of a semiconductor device according to an example embodiment of the inventive concepts.
Figure 15:
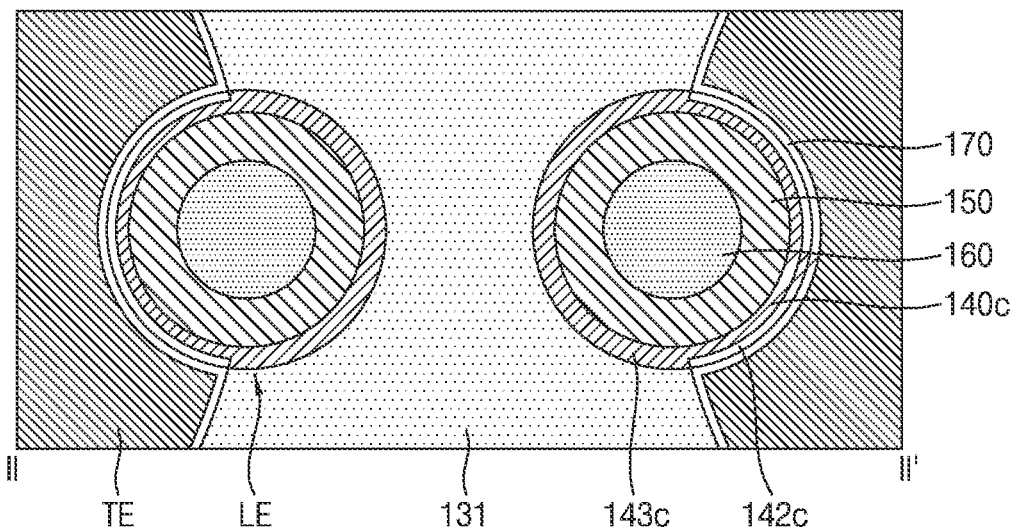
FIG. 15 is a horizontal cross-sectional view taken along line II-II' of the semiconductor device illustrated in FIG. 14.

FIG. 14 is a vertical cross-sectional view of a semiconductor device according to an example embodiment of the inventive concepts. FIG. 15 is a horizontal cross-sectional view taken along line II-II' of the semiconductor device illustrated in FIG. 14.

Referring to FIG. 14, a lower electrode LE of the semiconductor device 100c may include a first outer protective layer 140c, a second outer protective layer 142c, a first metal layer 143c, a second metal layer 144c, a third metal layer 145c, and a lower metal layer 146c. Referring to FIG. 10, portions of the preliminary protective layer 140 may not be oxidized in the process of oxidizing the preliminary protective layer 140. The first outer protective layer 140c illustrated in FIG. 14 may be a preliminary protective layer 140 which is not oxidized and remains. In an embodiment, the first outer protective layer 140c may cover a side surface and a bottom surface of a conductive layer 150. The second outer protective layer 142c may cover a side surface of the first outer protective layer 140c. An upper surface of the second outer protective layer 142c may cover an upper surface of the first outer protective layer 140c. An upper surface of the second outer protective layer 142c may be disposed at a higher level than an upper surface of the first outer protective layer 140c. For example, the second outer protective layer 142c may cover an upper surface of the first outer protective layer 140c, and an upper surface of the second outer protective layer 142c may be coplanar with an upper surface of the conductive layer 150.

The first metal layer 143c may be disposed between the first supporter pattern 131 and the first outer protective layer 140c, the second metal layer 144c may be disposed between the second supporter pattern 133 and the first outer protective layer 140c, and the third metal layer 145c may be disposed between the third supporter pattern 135 and the first outer protective layer 140c. Upper surfaces and bottom surfaces of the first metal layer 143c, the second metal layer 144c, and the third metal layer 145c may contact the first outer protective layer 140c. The lower metal layer 146c may be disposed between the landing pad 102 and the conductive layer 150, and an upper surface of the lower metal layer 146c may contact the first outer protective layer 140c. The first metal layer 143c, the second metal layer 144c, and the third metal layer 145c may materially connect with the first outer protective layer 140c. For example, the first metal layer 143c, the second metal layer 144c, and the third metal layer 145c may protrude in a horizontal direction from a side surface of the first outer protective layer 140c to contact the first supporter pattern 131, the second supporter pattern 133, and the third supporter pattern 135.

Referring to FIG. 15, in the horizontal cross-sectional view, the first outer protective layer 140c and the first metal layer 143c may together surround the conductive layer 150. In an embodiment, the first metal layer 143c may be disposed between the conductive layer 150 and the first supporter pattern 131, and the first outer protective layer 140c may be disposed between the conductive layer 150 and the upper electrode TE. A diameter-direction thickness of the first outer protective layer 140c may be less than that of the first metal layer 143c. The second outer protective layer 142c may have an arc shape and may be disposed between the first outer protective layer 140c and the upper electrode TE.

Figure 16:
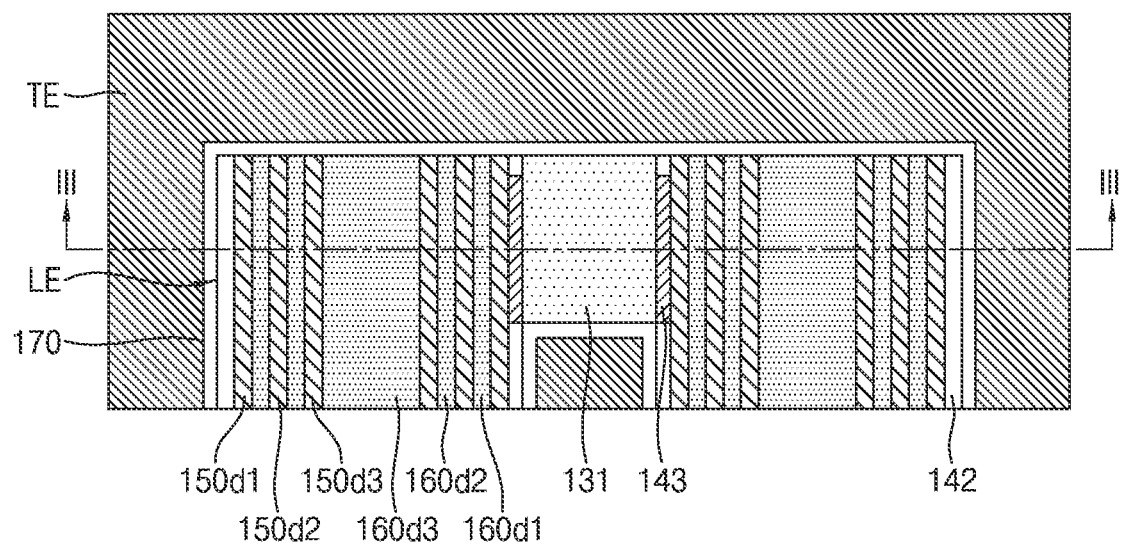
FIG. 16 is an enlarged view of a semiconductor device according to an example embodiment of the inventive concepts.
Figure 17:
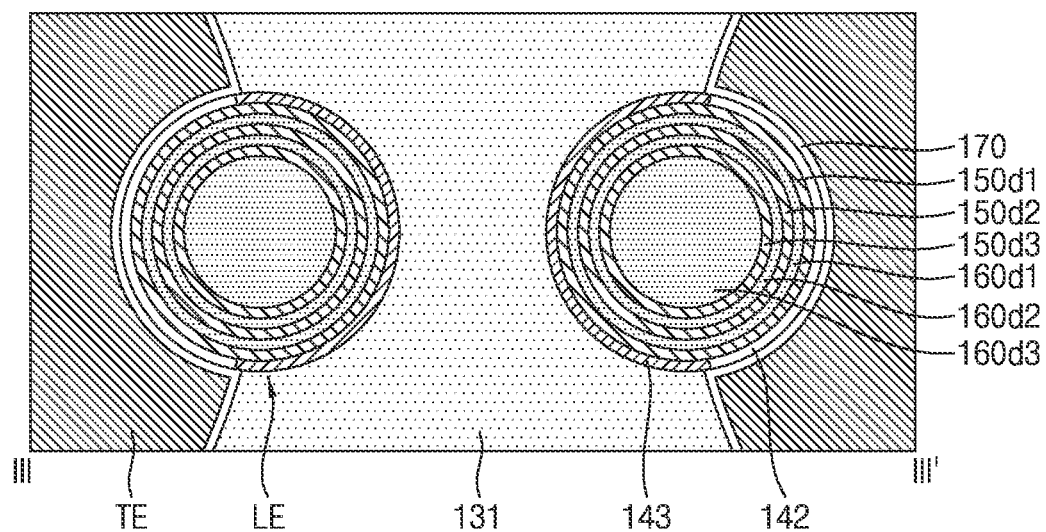
FIG. 17 is a horizontal cross-sectional view taken along line III-III' of the semiconductor device illustrated in FIG. 16.

FIG. 16 is an enlarged view of a semiconductor device according to an example embodiment of the inventive concepts. FIG. 17 is a horizontal cross-sectional view taken along line of the semiconductor device illustrated in FIG. 16.

Referring to FIGS. 16 and 17, a lower electrode LE of the semiconductor device 100d may include a plurality of conductive layers and a plurality of inner protective layers.

In an embodiment, the lower electrode LE may include a first conductive layer 150*d*1, a first inner protective layer 160*d*1, a second conductive layer 150*d*2, a second inner protective layer 160*d*2, a third conductive layer 150*d*3, and a third inner protective layer 160*d*3 in sequence from an outer portion of the lower electrode LE to an inner portion of the lower electrode LE. In the horizontal cross-sectional view, the first conductive layer 150*d*1, the first inner protective layer 160*d*1, the second conductive layer 150*d*2, the second inner protective layer 160*d*2, and the third conductive layer 150*d*3 may have a ring shape, and the third inner protective layer 160*d*3 may have a circular shape. An outer protective layer 142 and a first metal layer 143 may each have an arc shape and may together surround the first conductive layer 150*d*1.

Figure 18:
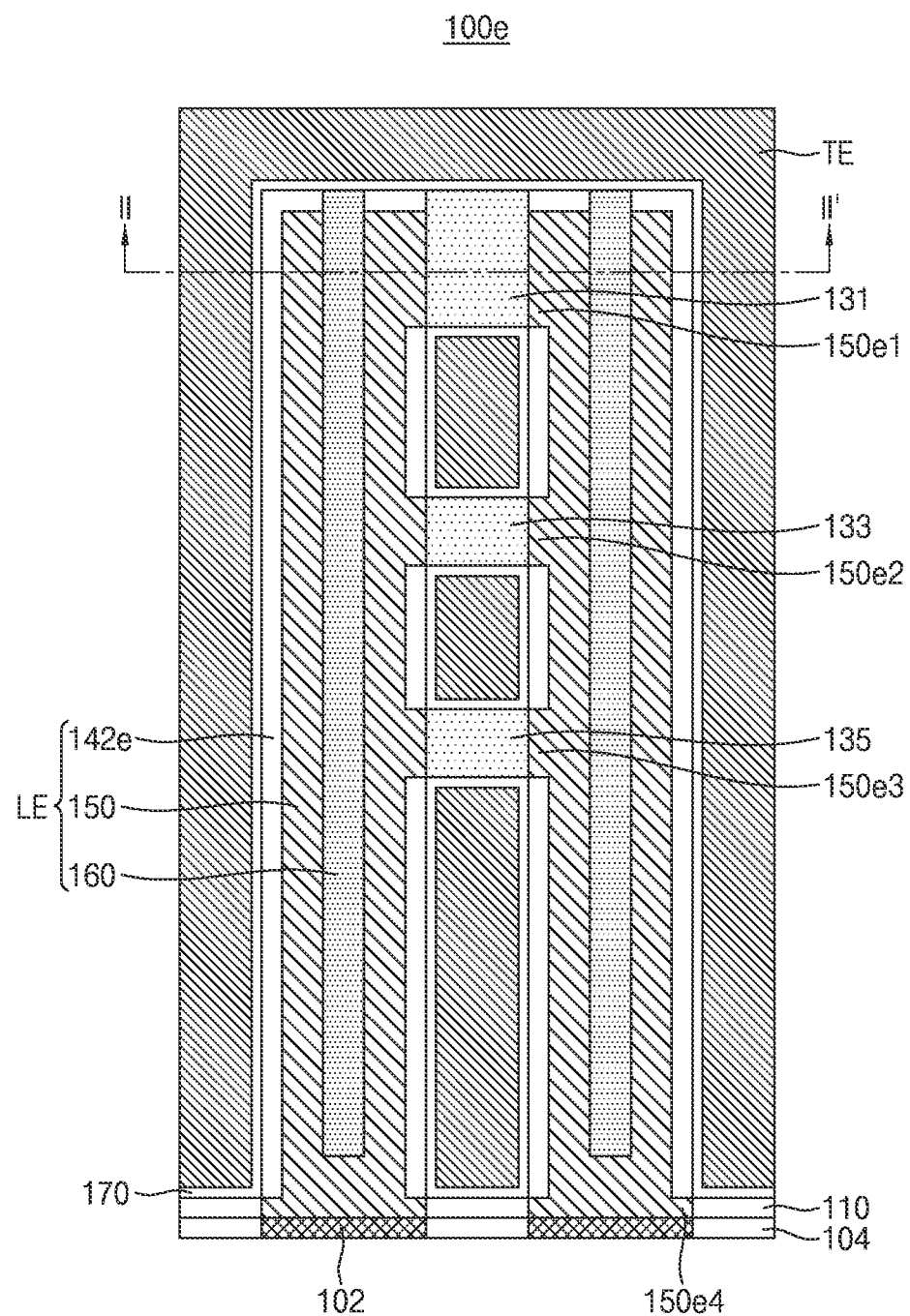
FIG. 18 is a vertical cross-sectional view of a semiconductor device according to an example embodiment of the inventive concepts.
Figure 19:
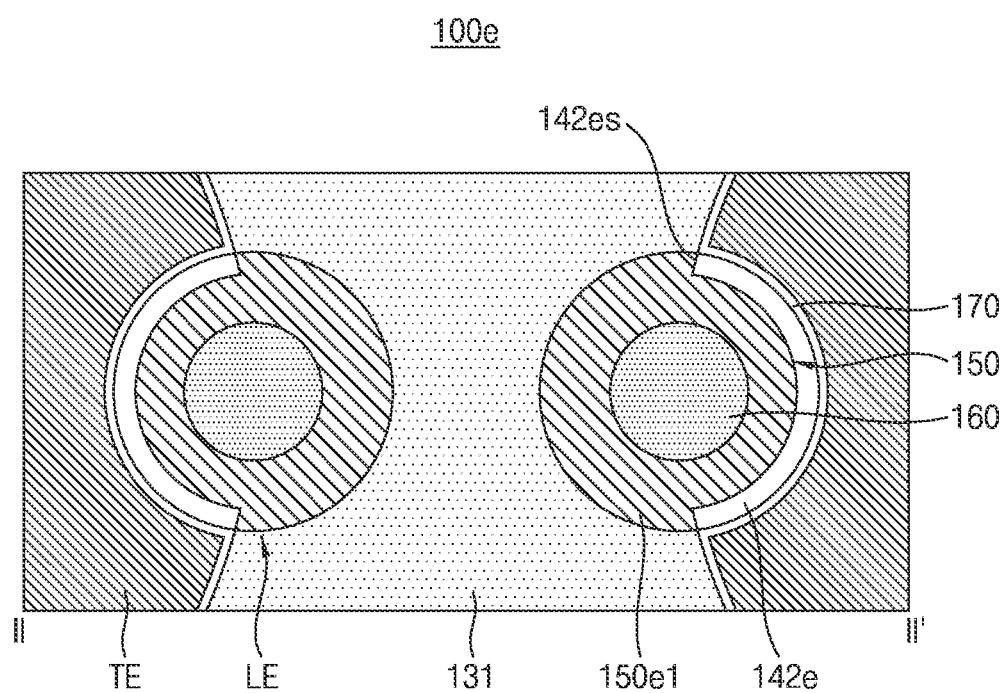
FIG. 19 is a horizontal cross-sectional view taken along line II-II' of the semiconductor device illustrated in FIG. 18.

FIG. 18 is a vertical cross-sectional view of a semiconductor device according to an example embodiment of the inventive concepts. FIG. 19 is a horizontal cross-sectional view taken along line II-II' of the semiconductor device illustrated in FIG. 18.

Referring to FIG. 18, a lower electrode LE of the semiconductor device 100*e* may include an outer protective layer 142*e*, a conductive layer 150, and an inner protective layer 160. In an embodiment, the outer protective layer 142*e* may surround at least a portion of each of a side surface and an upper surface of the conductive layer 150. For example, an upper surface of the outer protective layer 142*e* may be disposed at the same level as upper surfaces of a first supporter pattern 131 and the inner protective layer 160, and an upper surface of the conductive layer 150 may be disposed at a lower level than upper surfaces of the first supporter pattern 131 and the inner protective layer 160.

In an embodiment, the conductive layer 150 may include a first protrusion 150*e*1, a second protrusion 150*e*2, a third protrusion 150*e*3, and a lower protrusion 150*e*4. The first protrusion 150*e*1, the second protrusion 150*e*2, and the third protrusion 150*e*3 may protrude in a horizontal direction from a side surface of the conductive layer 150 to contact the first supporter pattern 131, the second supporter pattern 133, and the third supporter pattern 135, respectively. Upper surfaces and bottom surfaces of the first protrusion 150*e*1, the second protrusion 150*e*2, and the third protrusion 150*e*3 may contact an outer protective layer 142*e*. The lower protrusion 150*e*4 may be disposed under the conductive layer 150 and may protrude in a horizontal direction from the side surface of the conductive layer 150. An upper surface of the lower protrusion 150*e*4 may contact a lower surface of the outer protective layer 142*e*.

Referring to FIG. 19, in the horizontal cross-sectional view, the conductive layer 150 may have a circular shape including a stepped portion. For example, the first protrusion 150*e*1 of the conductive layer 150 may protrude in a diameter direction and may contact the first supporter pattern 131. The outer protective layer 142*e* may have an arc shape which extends in a circumferential direction and may be disposed between the conductive layer 150 and an upper electrode TE. The outer protective layer 142*e* may contact the first protrusion 150*e*1. For example, in a circumferential direction, an end surface 142*es* of the outer protective layer 142*e* may contact the first protrusion 150*e*1.

Figure 20:
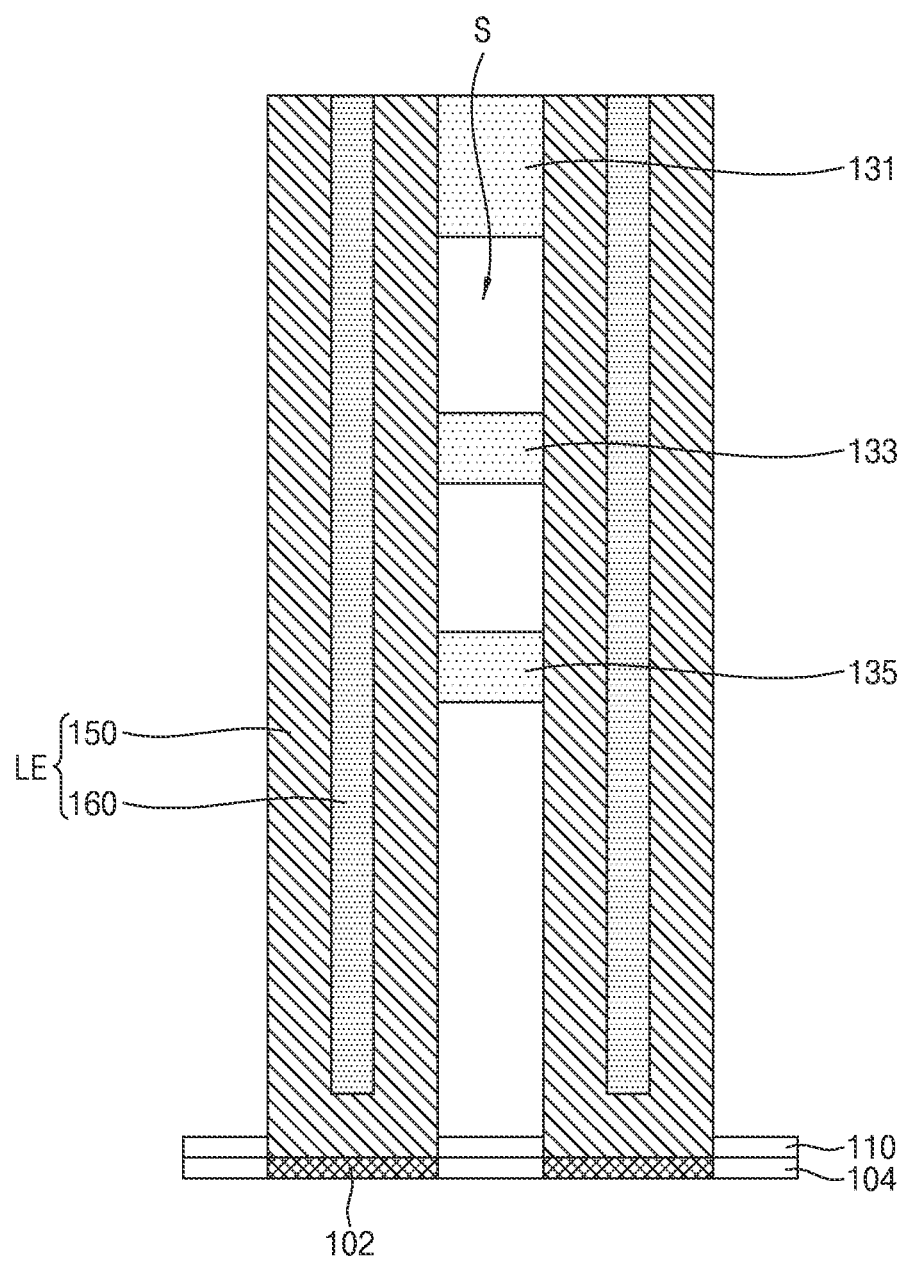
FIGS. 20 to 22 are cross-sectional views illustrating, in process order, a method of manufacturing a semiconductor device illustrated in FIG. 18.
Figure 21:
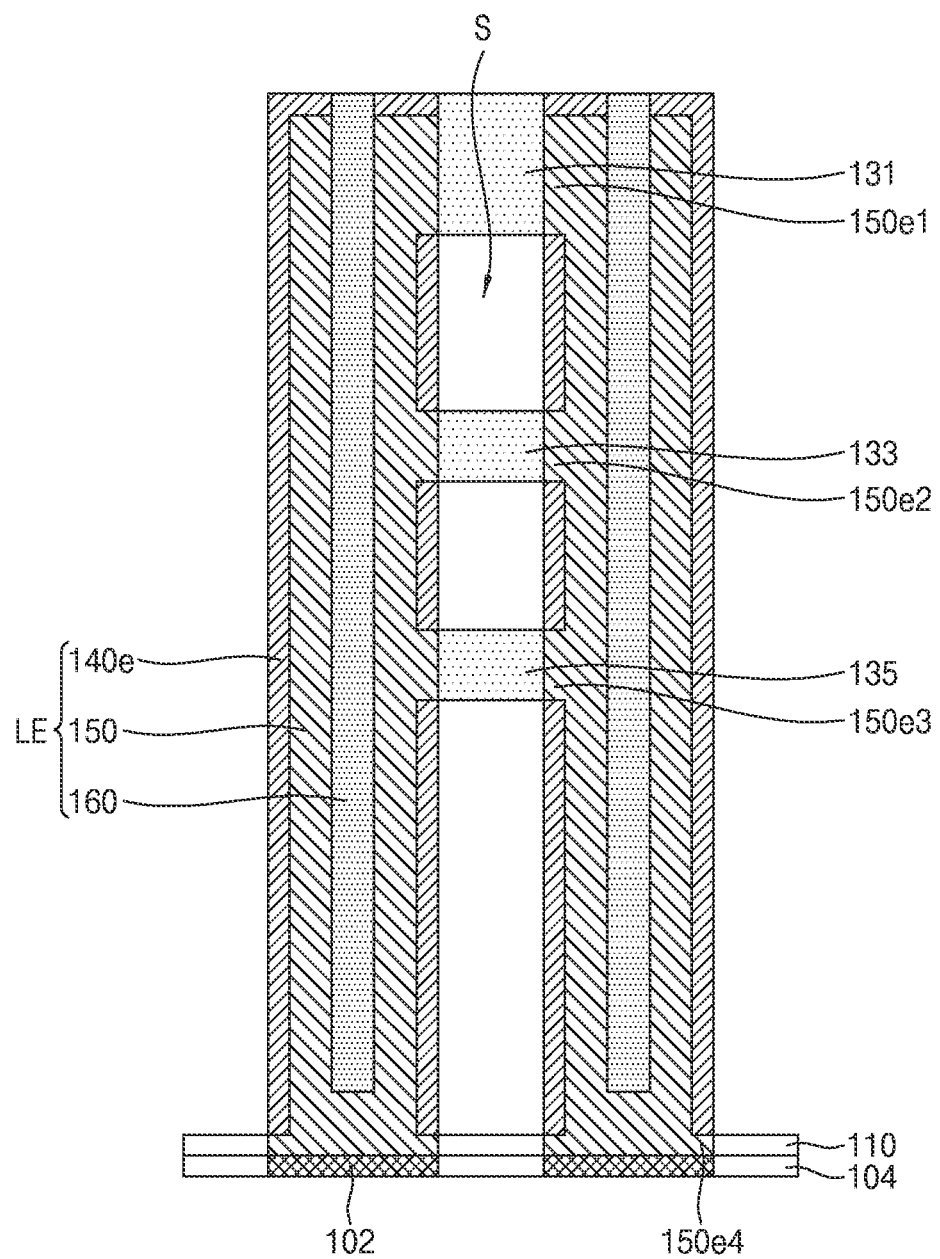
Figure 22:
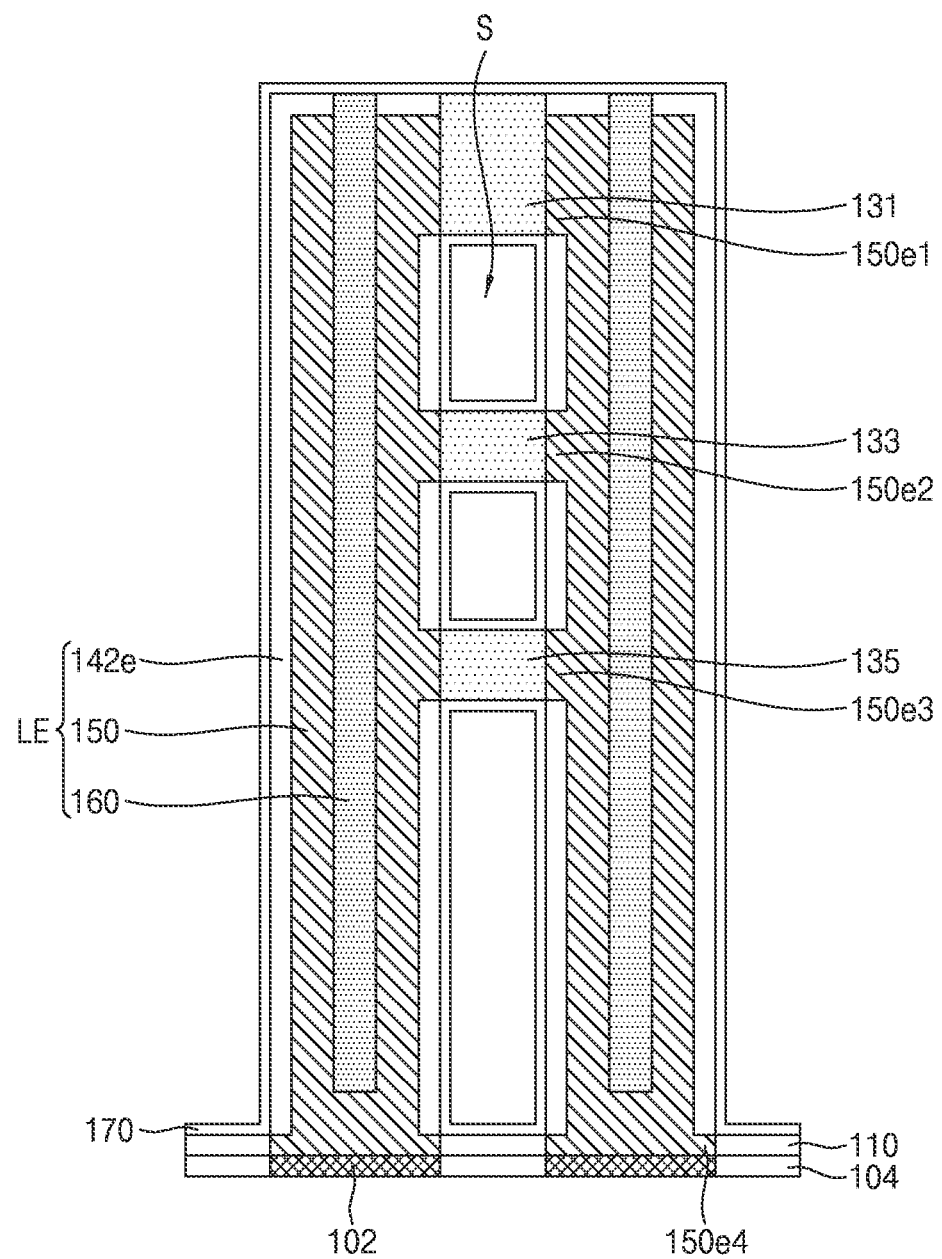

FIGS. 20 to 22 are cross-sectional views illustrating, in process order, a method of manufacturing a semiconductor device illustrated in FIG. 18.

Referring to FIGS. 9 and 20, a lower electrode LE may include a conductive layer 150 including a U-shaped cross-sectional surface and an inner protective layer 160 inside (e.g., filled into or otherwise between opposing sidewalls of) the conductive layer 150. A side surface of the lower electrode LE and upper surfaces and bottom surfaces of a first supporter pattern 131, a second supporter pattern 133, and a third supporter pattern 135 may be exposed at an empty space S.

Referring to FIG. 21, a preliminary protective layer 140*e* may be formed on a surface of the conductive layer 150. A process of forming the preliminary protective layer 140*e* may include a process of reducing a portion of the conductive layer 150 including TiN into Ti. For example, Ti may be formed by processing TiN with $H_1$ or $H_2$ plasma.

The preliminary protective layer 140*e* may be formed along exposed surfaces of the conductive layer 150 in FIG. 20. For example, the preliminary protective layer 140*e* may cover a side surface and an upper surface of the conductive layer 150. An upper surface of the preliminary protective layer 140*e* may be disposed at the same level as upper surfaces of the first supporter pattern 131 and the inner protective layer 160.

In an embodiment, at least a portion of the side surface of the conductive layer 150 may not be reduced. For example, the conductive layer 150 may include a first protrusion 150*e*1, a second protrusion 150*e*2, and a third protrusion 150*e*3, which protrude in a horizontal direction from the side surface of the conductive layer 150 to contact the first supporter pattern 131, the second supporter pattern 133, and the third supporter pattern 135, respectively. The lower protrusion 150*e*4 may be disposed under the preliminary protective layer 140*e* and may protrude in a horizontal direction from the side surface of the conductive layer 150.

Referring to FIG. 22, an outer protective layer 142*e* and a dielectric layer 170 may be formed. In an embodiment, the outer protective layer 142*e* may be formed by oxidizing the preliminary protective layer 140*e* in a process of forming the dielectric layer 170. The outer protective layer 142*e* may include titanium oxide. In another embodiment, a process of oxidizing the preliminary protective layer 140*e* may be separately performed before the dielectric layer 170 is formed.

Referring again to FIG. 18, the upper electrode TE may be formed on the dielectric layer 170 and may be on (e.g., may cover) the lower electrode LE, the first supporter pattern 131, the second supporter pattern 133, and the third supporter pattern 135.

Figure 23:
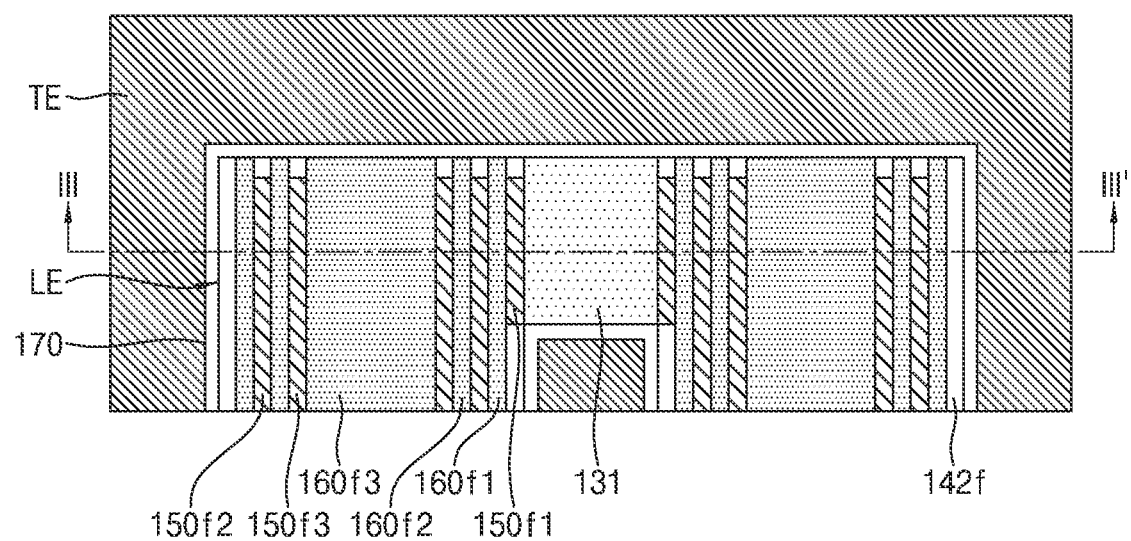
FIG. 23 is an enlarged view of a semiconductor device according to an example embodiment of the inventive concepts.
Figure 24:
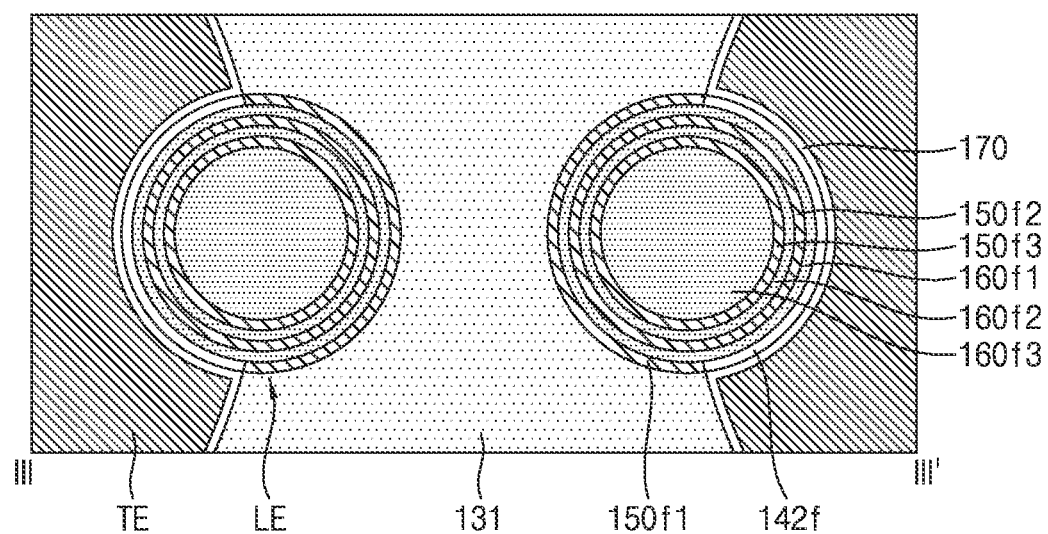
FIG. 24 is a horizontal cross-sectional view taken along line III-III' of the semiconductor device illustrated in FIG. 23.

FIG. 23 is an enlarged view of a semiconductor device according to an example embodiment of the inventive concepts. FIG. 24 is a horizontal cross-sectional view taken along line III-III' of the semiconductor device illustrated in FIG. 23.

Referring to FIGS. 23 and 24, a lower electrode LE of the semiconductor device 100*f* may include a plurality of conductive layers and a plurality of inner protective layers. In an embodiment, the lower electrode LE may include a first conductive layer 150*f*1, a first inner protective layer 160*f*1, a second conductive layer 150*f*2, a second inner protective layer 160*f*2, a third conductive layer 150*f*3, and a third inner protective layer 160*f*3 in sequence from an outer portion of the lower electrode LE to an inner portion of the lower electrode LE. In the horizontal cross-sectional view, the first inner protective layer 160*f*1, the second conductive layer 150*f*2, the second inner protective layer 160*f*2, and the third conductive layer 150*f*3 may have a ring shape, and the third inner protective layer 160*f*3 may have a circular shape. The outer protective layer 142*f* and the first conductive layer 150*f*1 may each have an arc shape and may together surround the first inner protective layer 160*f*1. The outer protective layer 142*f* may be disposed between the first inner protective layer 160f1 and an upper electrode TE, and the first conductive layer 150f1 may contact a first supporter pattern 131. As described above with reference to FIGS. 21 and 22, the outer protective layer 142f may be formed by performing a reduction process and an oxidization process on the first conductive layer 150f1.

Figure 25:
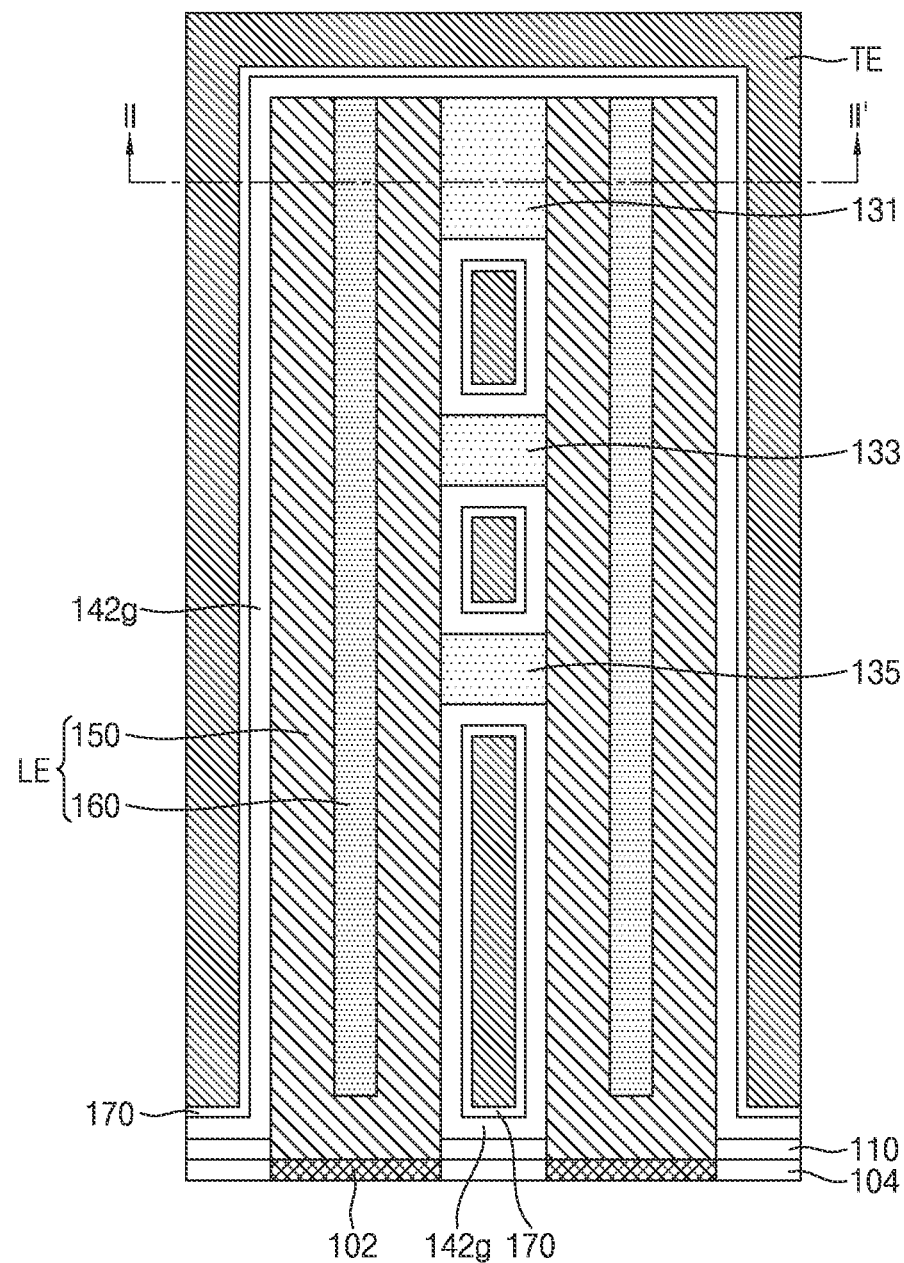
FIG. 25 is a vertical cross-sectional view of a semiconductor device according to an example embodiment of the inventive concepts.
Figure 26:
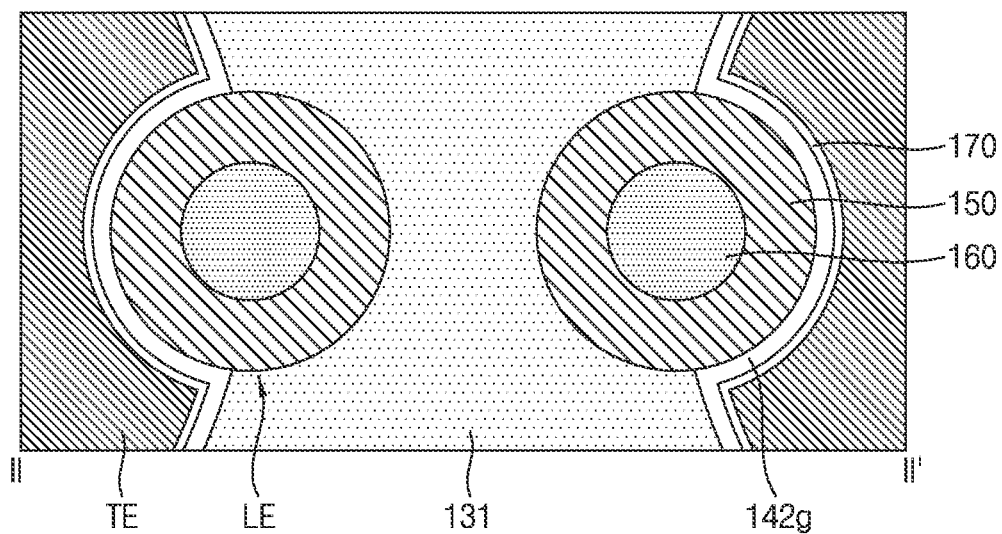
FIG. 26 is a horizontal cross-sectional view taken along line II-II' of the semiconductor device illustrated in FIG. 25.

FIG. 25 is a vertical cross-sectional view of a semiconductor device according to an example embodiment of the inventive concepts. FIG. 26 is a horizontal cross-sectional view taken along line II-II' of the semiconductor device illustrated in FIG. 25.

Referring to FIG. 25, the semiconductor device 100g may include a lower electrode LE, including a conductive layer 150 and an inner protective layer 160, and an outer protective layer 142g. The conductive layer 150 may include a U-shaped cross-sectional surface, and the inner protective layer 160 may be inside (e.g., filled into or otherwise between opposing sidewalls of) the conductive layer 150. In an embodiment, a bottom surface of the conductive layer 150 may contact a landing pad 102, and a horizontal width of the bottom surface of the conductive layer 150 may be substantially the same as a horizontal width of an upper surface of the landing pad 102. The outer protective layer 142g may be conformally disposed along a surface of each of a first supporter pattern 131, a second supporter pattern 133, a third supporter pattern 135, and the lower electrode LE.

Referring to FIG. 26, in the horizontal cross-sectional view, the conductive layer 150 and the inner protective layer 160 may have a circular shape. The conductive layer 150 may contact the first supporter pattern 131. The outer protective layer 142g may be disposed along a surface of the conductive layer 150 and the surface of the first supporter pattern 131, and a dielectric layer 170 may be disposed between the outer protective layer 142g and an upper electrode TE.

Figure 27:
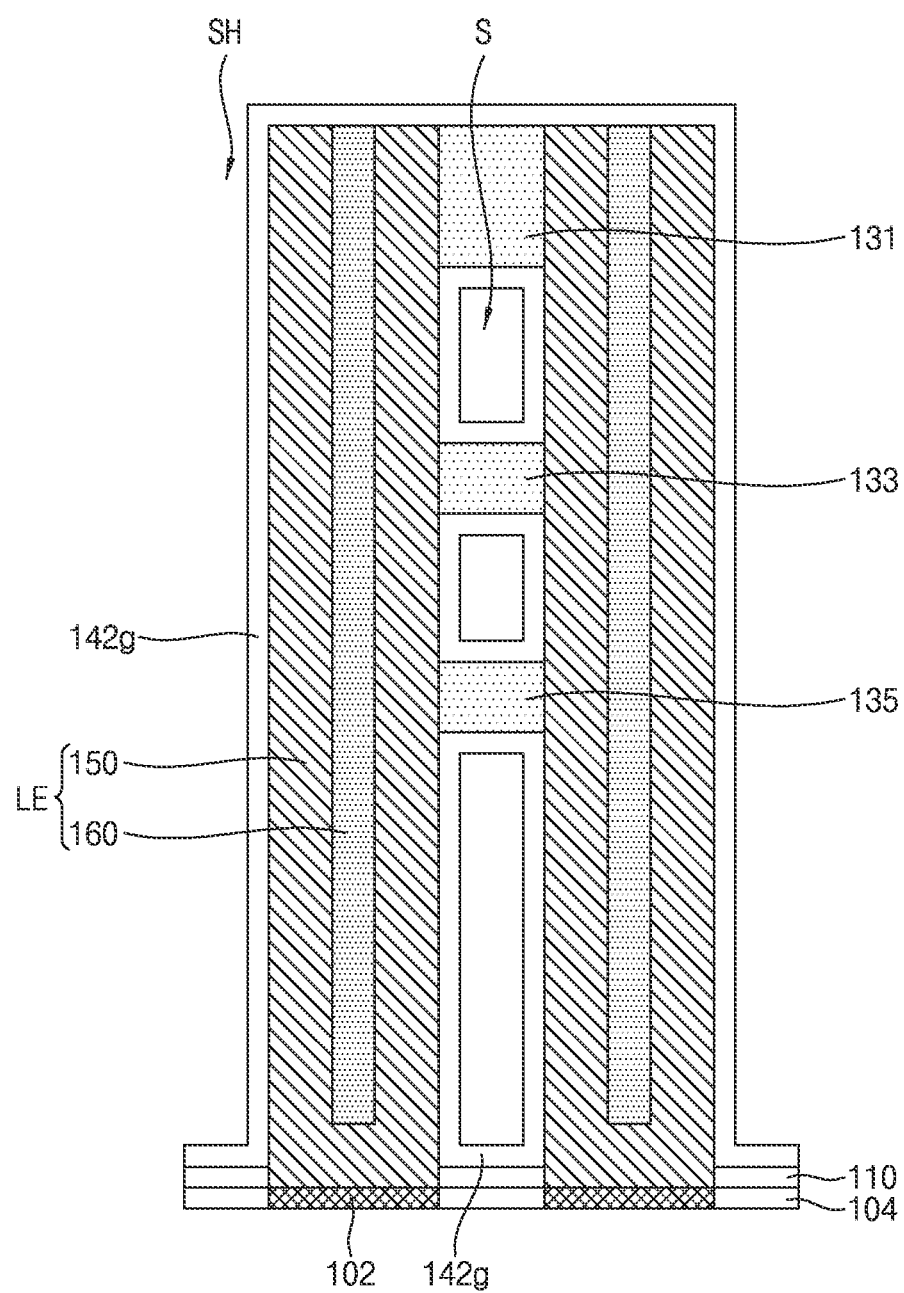
FIGS. 27 and 28 are cross-sectional views illustrating, in process order, a method of manufacturing a semiconductor device illustrated in FIG. 25.
Figure 28:
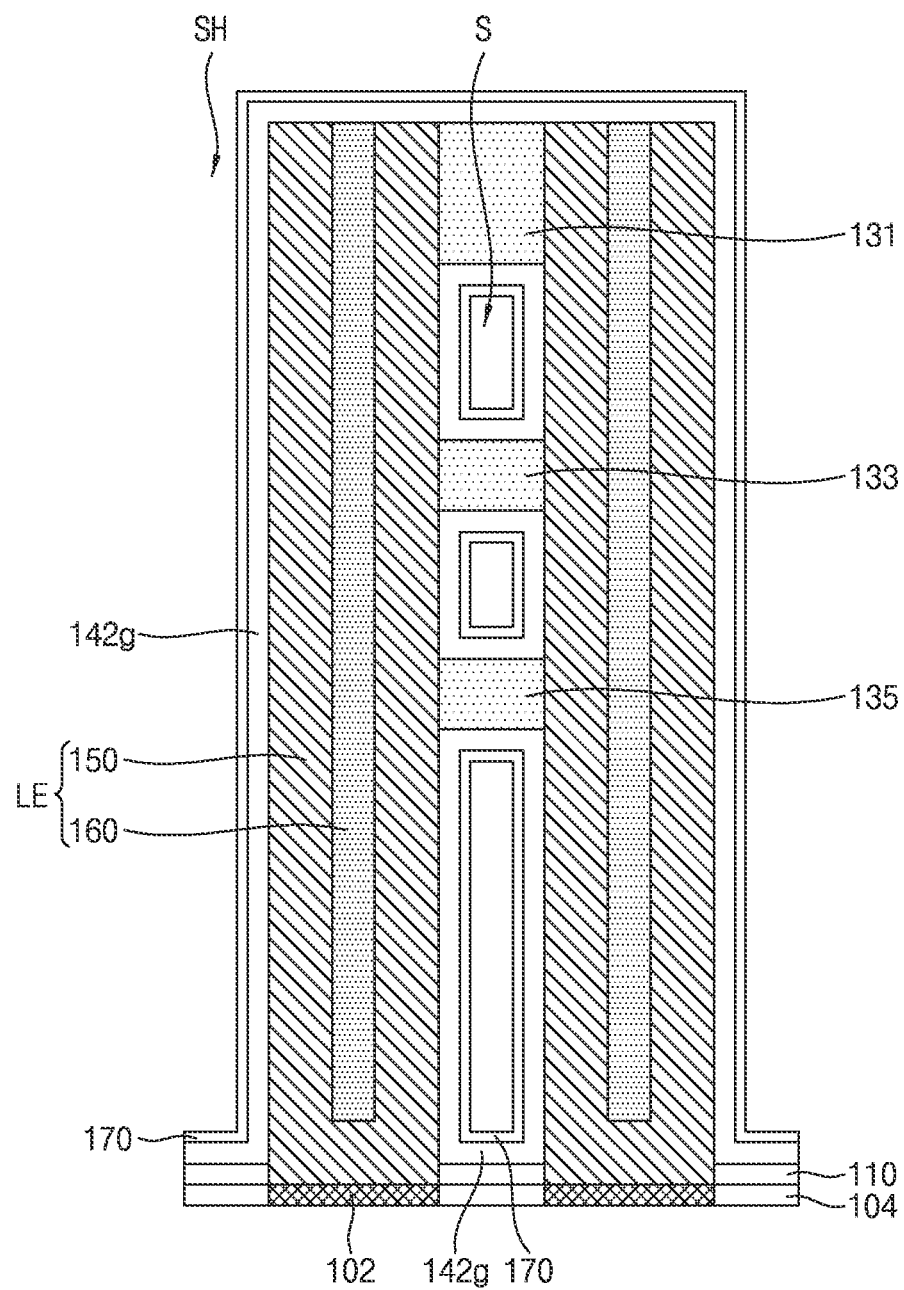

FIGS. 27 and 28 are cross-sectional views illustrating, in process order, a method of manufacturing a semiconductor device illustrated in FIG. 25.

Referring to FIGS. 9 and 27, a lower electrode LE may include a conductive layer 150 including a U-shaped cross-sectional surface and an inner protective layer 160 inside (e.g., filled into or otherwise between opposing sidewalls of) the conductive layer 150. The lower electrode LE, a first supporter pattern 131, a second supporter pattern 133, and a third supporter pattern 135 may be exposed, and then, an outer protective layer 142g may be deposited thereon. The outer protective layer 142g may be conformally formed along a surface of each of the lower electrode LE, the first supporter pattern 131, the second supporter pattern 133, and the third supporter pattern 135.

Referring to FIG. 28, a dielectric layer 170 may be formed on a resultant material/structure of FIG. 27. For example, the dielectric layer 170 may be conformally formed on the outer protective layer 142g.

Referring again to FIG. 25, the upper electrode TE may be formed on the dielectric layer 170.

Figure 29:
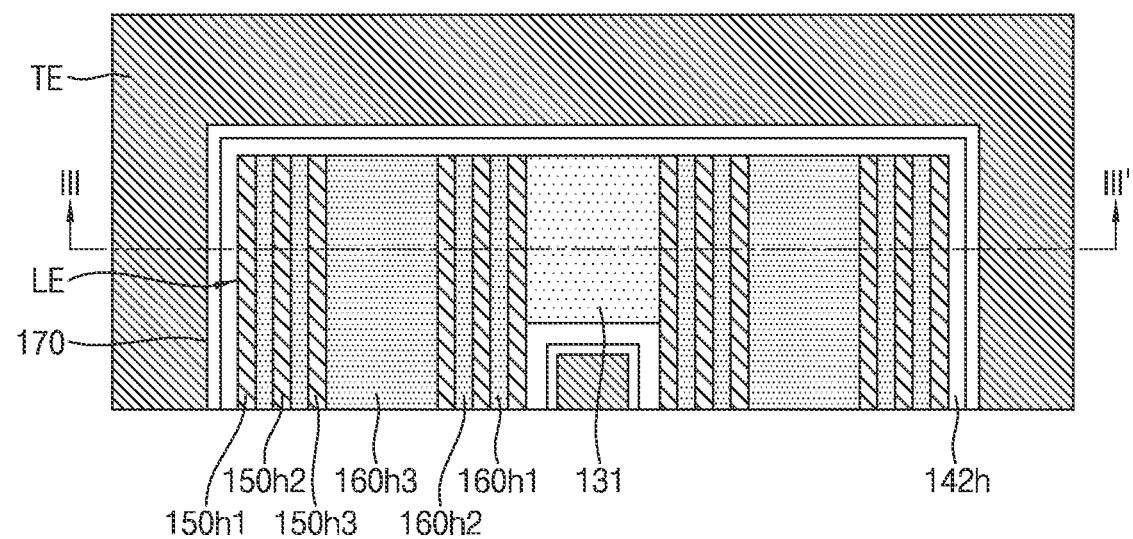
FIG. 29 is an enlarged view of a portion of a semiconductor device according to an example embodiment of the inventive concepts.
Figure 30:
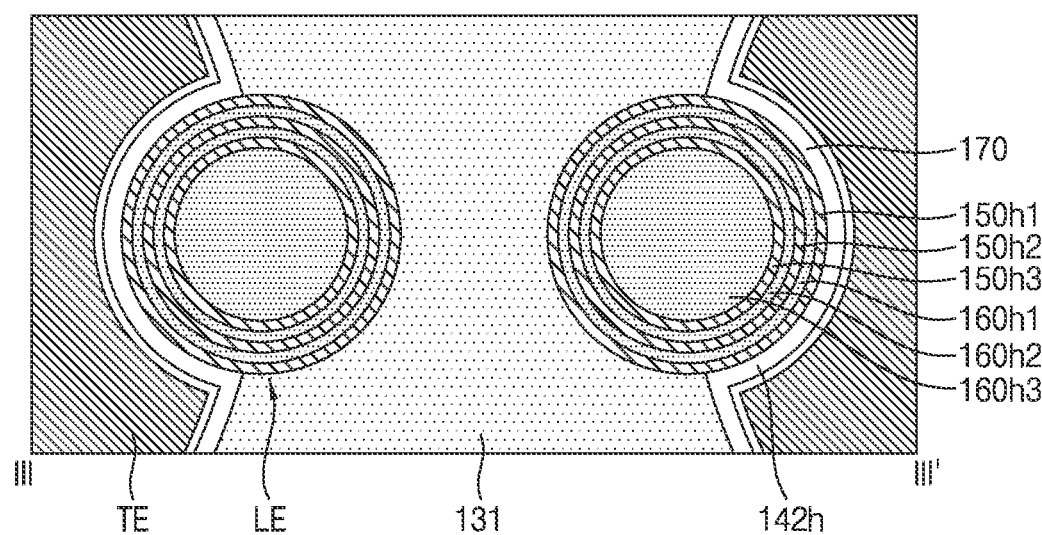
FIG. 30 is a horizontal cross-sectional view taken along line III-III' of the semiconductor device illustrated in FIG. 29.

FIG. 29 is an enlarged view of a portion of a semiconductor device according to an example embodiment of the inventive concepts. FIG. 30 is a horizontal cross-sectional view taken along line of the semiconductor device illustrated in FIG. 29.

Referring to FIGS. 29 and 30, a lower electrode LE of the semiconductor device 100h may include a plurality of conductive layers and a plurality of inner protective layers. In an embodiment, the lower electrode LE may include a first conductive layer 150h1, a first inner protective layer 160h1, a second conductive layer 150h2, a second inner protective layer 160h2, a third conductive layer 150h3, and a third inner protective layer 160h3 in sequence from an outer portion of the lower electrode LE to an inner portion of the lower electrode LE. In the horizontal cross-sectional view, the first conductive layer 150h1, the first inner protective layer 160h1, the second conductive layer 150h2, the second inner protective layer 160h2, and the third conductive layer 150h3 may have a ring shape, and the third inner protective layer 160h3 may have a circular shape. The outer protective layer 142h may be disposed along a surface of each of the first conductive layer 150h1 and the first supporter pattern 131, and the dielectric layer 170 may be disposed between the outer protective layer 142h and an upper electrode TE.

Figure 31:
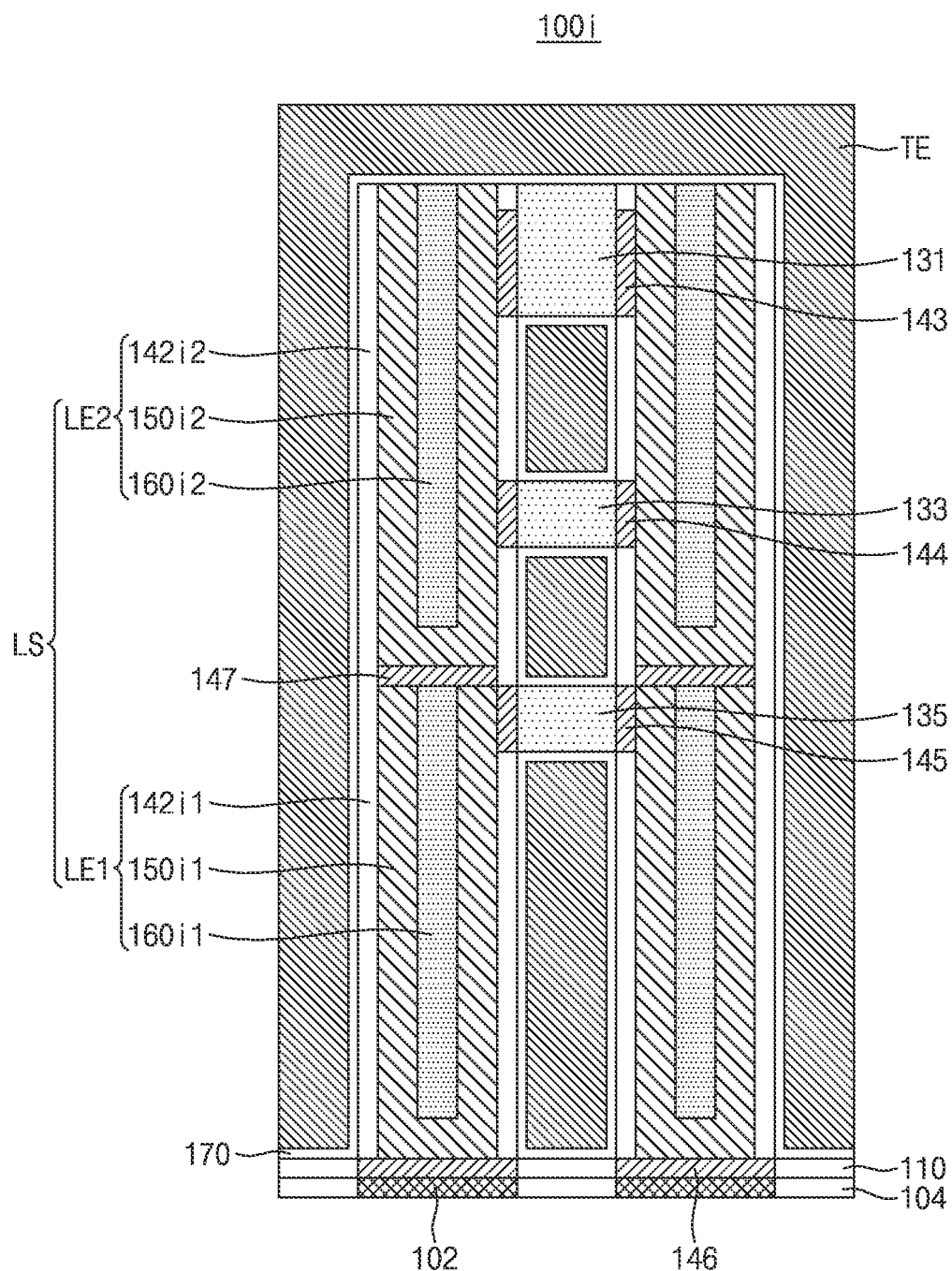
FIG. 31 is a vertical cross-sectional view of a semiconductor device according to an example embodiment of the inventive concepts.

FIG. 31 is a vertical cross-sectional view of a semiconductor device according to an example embodiment of the inventive concepts.

Referring to FIG. 31, the semiconductor device 100i may include a lower electrode structure LS which includes a first lower electrode LE1 and a second lower electrode LE2. The first lower electrode LE1 may be disposed on a landing pad 102 and may include a first outer protective layer 142i1, a first conductive layer 150i1, and a first inner protective layer 160i1. The second lower electrode LE2 may be disposed on the first lower electrode LE1 and may include a second outer protective layer 142i2, a second conductive layer 150i2, and a second inner protective layer 160i2. The first outer protective layer 142i1 and the second outer protective layer 142i2 may materially connect with each other.

The semiconductor device 100i may further include a first metal layer 143, a second metal layer 143, a third metal layer 145, a lower metal layer 146, and a buried layer 147. The first metal layer 143 may be disposed between a first supporter pattern 131 and the second conductive layer 150i2, and the second metal layer 144 may be disposed between a second supporter pattern 133 and the second conductive layer 150i2. The third metal layer 145 may be disposed between a third supporter pattern 135 and the first conductive layer 150i1. The lower metal layer 146 may be disposed between a landing pad 102 and the first conductive layer 150i1. The buried layer 147 may be disposed between the first lower electrode LE1 and the second lower electrode LE2. For example, a bottom surface of the buried layer 147 may contact upper surfaces of the first conductive layer 150i1 and the first inner protective layer 160i1, and an upper surface of the buried layer 147 may contact a bottom surface of the second conductive layer 150i2. Also, a side surface of the buried layer 147 may contact the first outer protective layer 142i1.

FIGS. 32 to 36 are cross-sectional views illustrating, in process order, a method of manufacturing a semiconductor device illustrated in FIG. 31.

Figure 32:
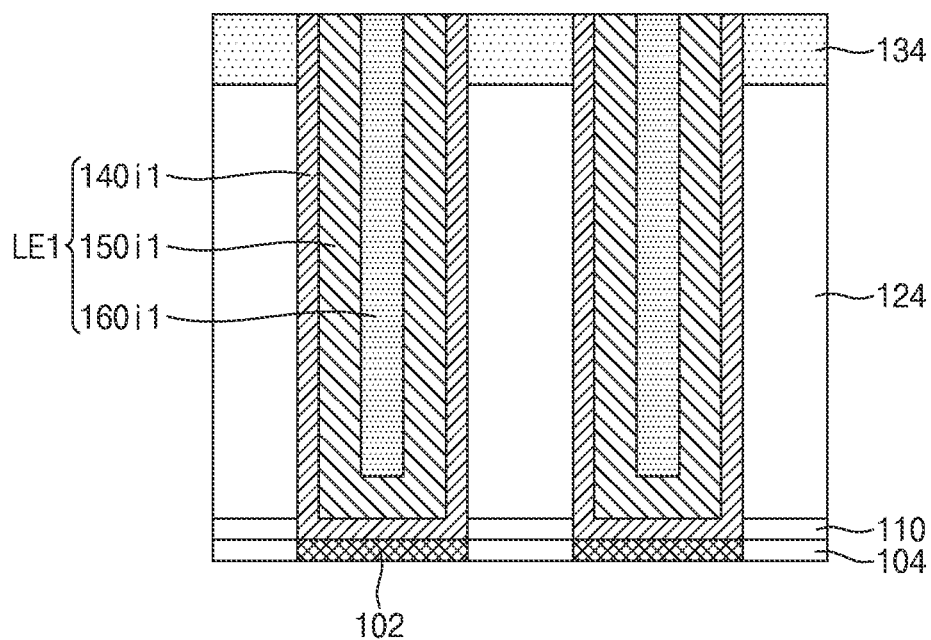
FIGS. 32 to 36 are cross-sectional views illustrating, in process order, a method of manufacturing a semiconductor device illustrated in FIG. 31.

Referring to FIG. 32, a first lower electrode LE1 passing through a third mold layer 124 and a third supporter layer 134 may be formed on a landing pad 102. The first lower electrode LE1 may include a first preliminary protective layer 140i1, a first conductive layer 150i1 in (e.g., between opposing sidewalls of) the first preliminary protective layer 140i1, and a first inner protective layer 160i1 inside (e.g., filled into or otherwise between opposing sidewalls of) the first conductive layer 150i1. A process of forming the first lower electrode LE1 may include a planarization process, and an upper surface of the first lower electrode LE1 may be disposed at the same level as an upper surface of a third supporter layer 134.

Figure 33:
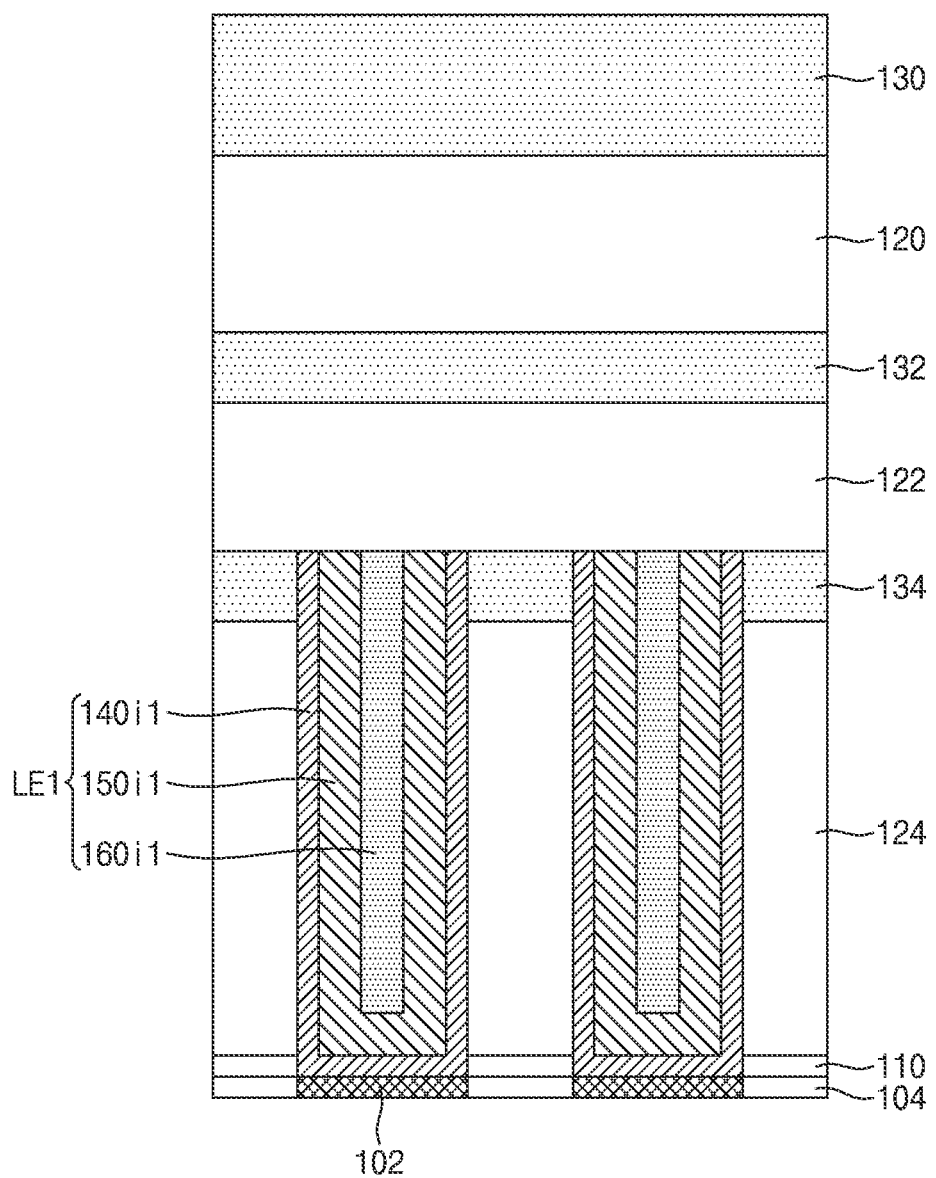

Referring to FIG. 33, a second mold layer 122, a second supporter layer 132, a first mold layer 120, and a first supporter layer 130 may be formed on a resultant material/structure of FIG. 32.

Figure 34:
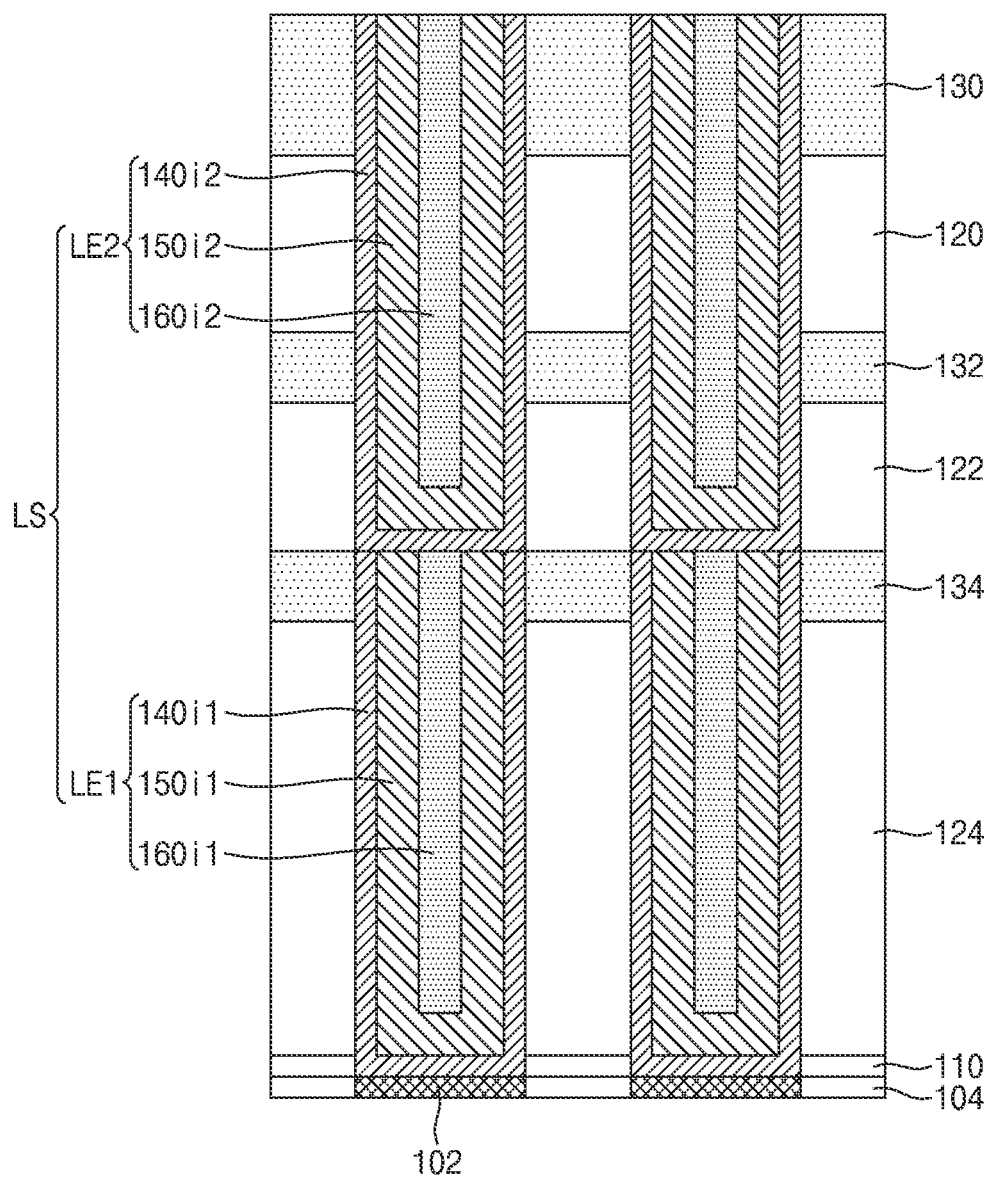

Referring to FIG. 34, a second lower electrode LE2 passing through a second mold layer 122, a second supporter layer 132, a first mold layer 120, and a first supporter layer 130 may be formed. The second lower electrode LE2 may include a second preliminary protective layer 140i2, a second conductive layer 150i2 in (e.g., between opposing sidewalls of) the second preliminary protective layer 140i2, and a second inner protective layer 160i2 inside (e.g., filled into or otherwise between opposing sidewalls of) the second conductive layer 150i2. The second lower electrode LE2 may be aligned with the first lower electrode LE1 in a direction vertical to the first lower electrode LE1. The first lower electrode LE1 and the second lower electrode LE2 may collectively provide a lower electrode structure LS.

Figure 35:
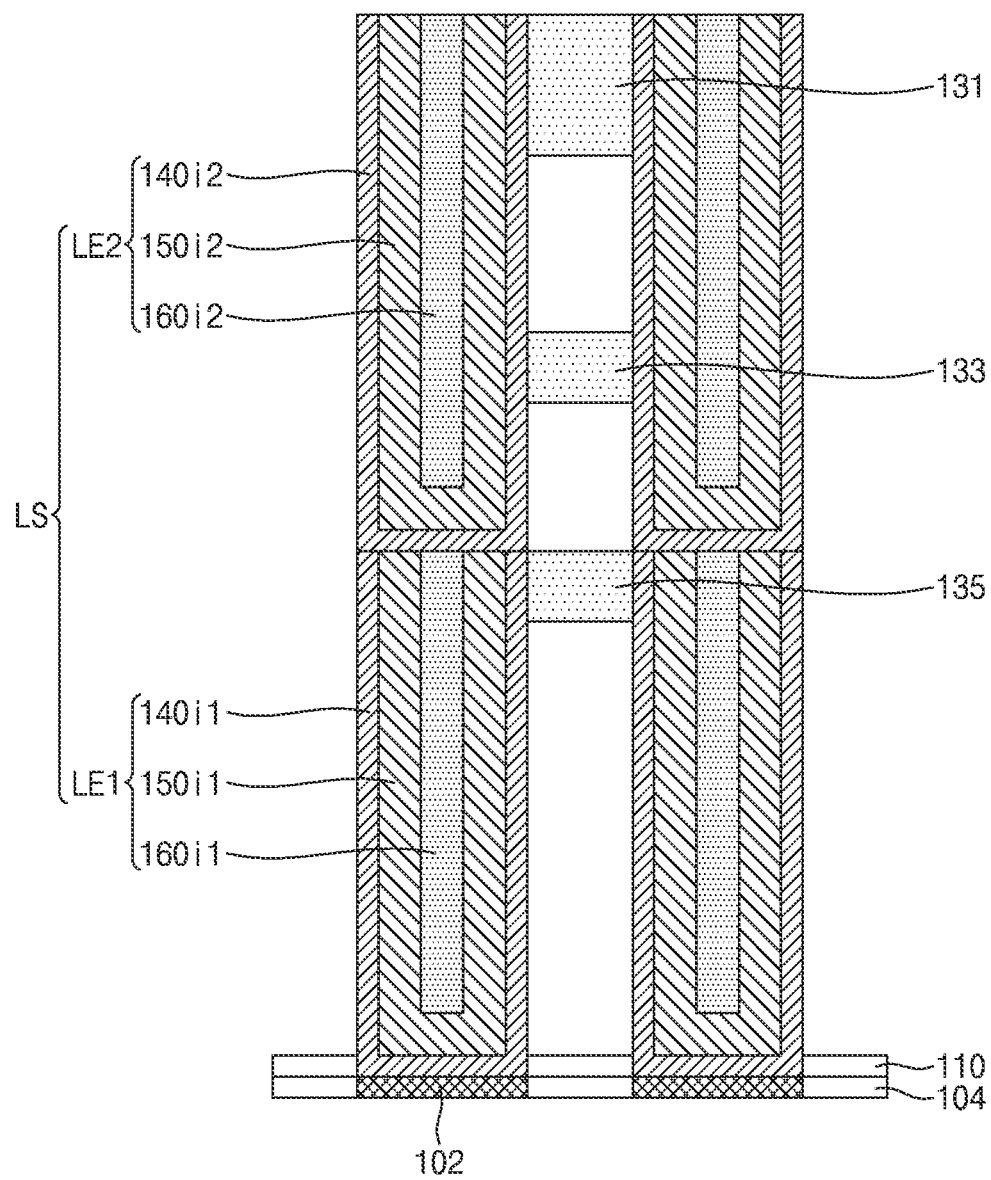

Referring to FIG. 35, the first mold layer 120, the second mold layer 122, and the third mold layer 124 may be removed. The first supporter pattern 131, the second supporter pattern 133, and the third supporter pattern 135 may be formed by patterning the first supporter layer 130, the second supporter layer 132, and the third supporter layer 134, respectively.

Figure 36:
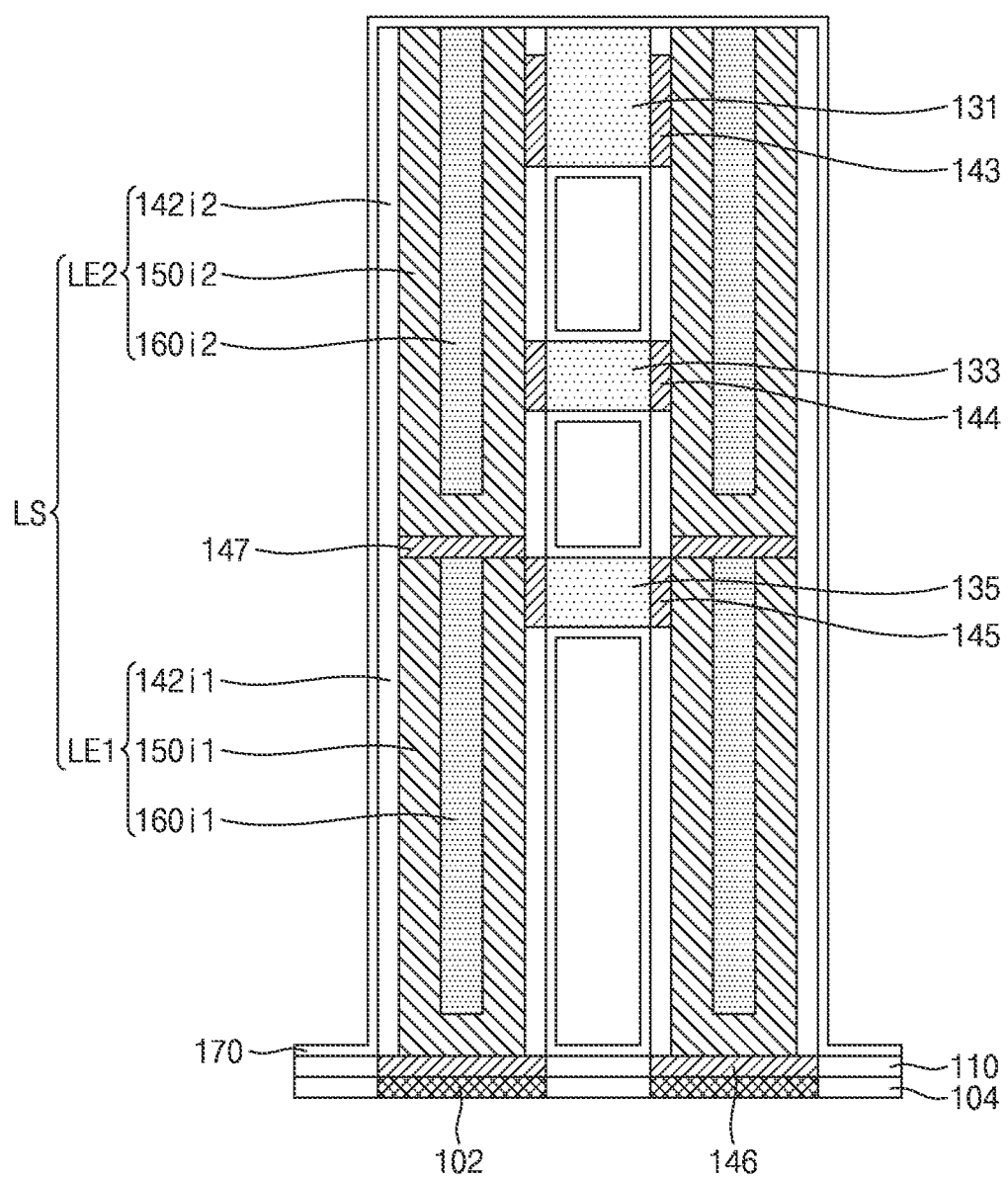

Referring to FIGS. 10 and 36, a first outer protective layer 142i1, a second outer protective layer 142i2, and a dielectric layer 170 may be formed. In an embodiment, the first outer protective layer 142i1 and the second outer protective layer 142i2 may be formed by oxidizing the first preliminary protective layer 140i1 and the second preliminary protective layer 140i2 in a process of forming the dielectric layer 170, respectively. In another embodiment, a process of oxidizing the first preliminary protective layer 140i1 and the second preliminary protective layer 140i2 may be separately performed before the dielectric layer 170 is formed. The first outer protective layer 142i1 may include the same material as that of the second outer protective layer 142i2, and the first outer protective layer 142i1 may materially connect with the second outer protective layer 142i2.

An unexposed portion of each of the first preliminary protective layer 140i1 and the second preliminary protective layer 140i2 may not be oxidized. As described above with reference to FIG. 10, a first metal layer 143, a second metal layer 144, a third metal layer 145, and a lower metal layer 146 may be disposed adjacent to the first conductive layer 150i1 and the second conductive layer 150i2. A buried layer 147 may be disposed between the first lower electrode LE1 and the second lower electrode LE2.

Referring again to FIG. 31, an upper electrode TE may be formed on the dielectric layer 170.

Figure 37:
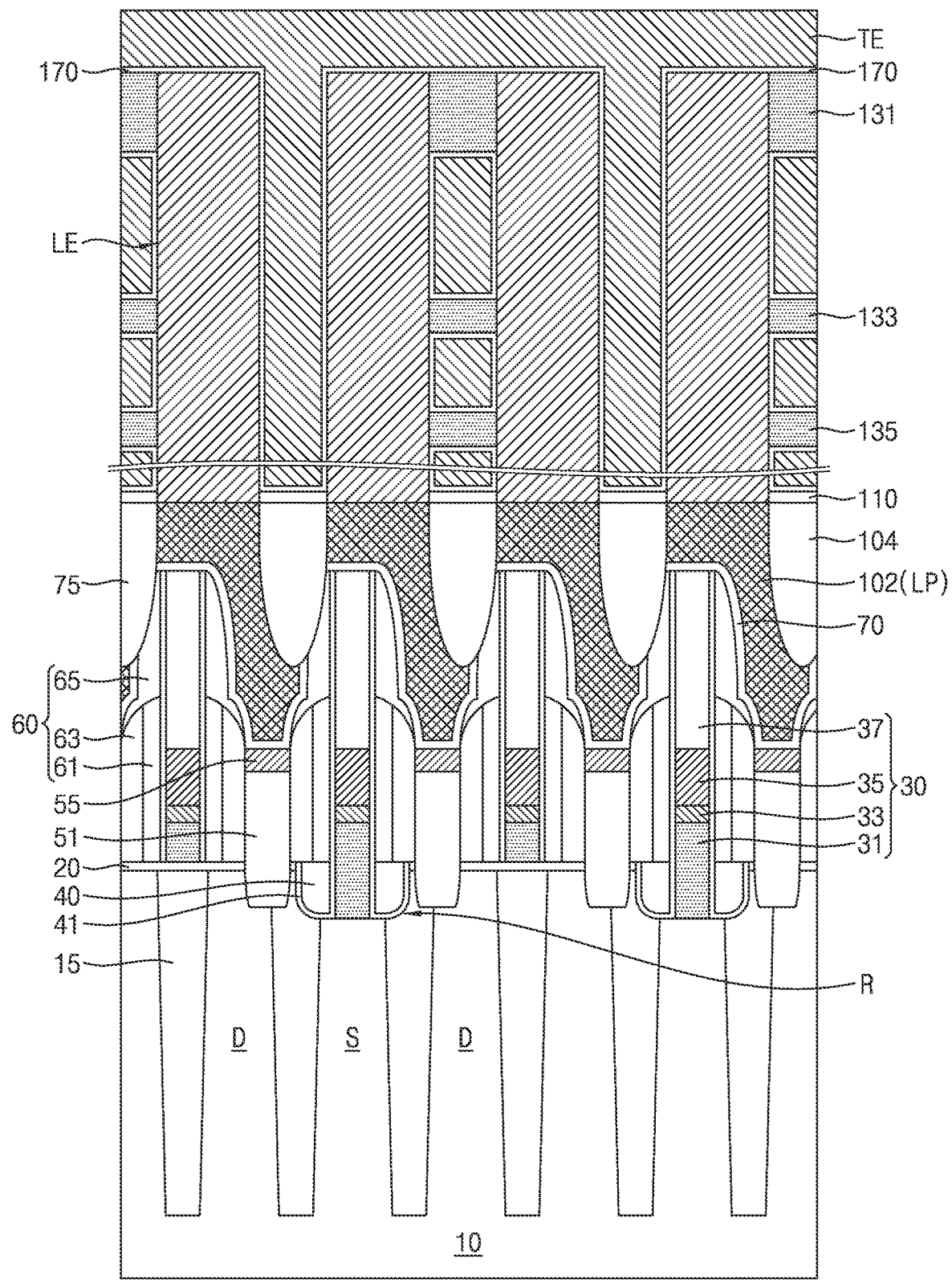
FIG. 37 is a vertical cross-sectional view of a semiconductor device according to an example embodiment of the inventive concepts.

FIG. 37 is a vertical cross-sectional view of a semiconductor device according to an example embodiment of the inventive concepts. Detailed descriptions of elements which are the same as or similar to the elements of FIGS. 1 and 2 may be omitted. The semiconductor device may include a memory cell. The memory cell may include a substrate 10, an interlayer insulation layer 20, a bit line structure 30, a recess filler 40, a storage contact 51, a contact buffer layer 55, a bit line spacer 60, a landing pad barrier layer 70, and a pad insulation layer 104.

The substrate 10 may include an isolation region 15, a source region S, and a drain region D. The substrate 10 may include a semiconductor material. For example, the substrate 10 may be a silicon substrate, a germanium substrate, a silicon germanium substrate, or a silicon on insulator (SOI) substrate. In an embodiment, the substrate 10 may include a Group IV semiconductor, Group III-VI compound semiconductor, or Group II-VI compound semiconductor. The isolation region 15 may have a shallow trench isolation (STI) structure and may include an insulating material. For example, the isolation region 15 may include silicon oxide, silicon nitride, silicon oxynitride, or a combination thereof. The source region S and the drain region D may include N-type impurities.

The interlayer insulation layer 20 may be disposed on an upper surface of the substrate 10. In an embodiment, the interlayer insulation layer 20 may include silicon oxide, silicon nitride, silicon oxynitride, or a combination thereof.

The bit line structure 30 may be disposed on the substrate 10. For example, the bit line structure 30 may be disposed on an upper surface of the interlayer insulation layer 20, or may be disposed to pass through a portion of an upper portion of the substrate 10. The bit line structure 30 may include a bit line contact 31, a bit line barrier layer 33, a bit line 35, and a bit line capping layer 37, which are sequentially stacked.

The bit line contact 31 may contact the source region S. The bit line 35 may be electrically connected to the source region S through the bit line contact 31 and the bit line barrier layer 33. The bit line contact 31 may include a conductor such as doped polycrystalline silicon. The bit line barrier layer 33 may include a barrier metal such as titanium nitride (TiN). The bit line 35 may include a metal such as tungsten (W). The bit line capping layer 37 may include silicon nitride and/or silicon oxynitride.

The recess filler 40 may be inside (e.g., filled into) a contact recess R which is formed in the upper surface of the substrate 10. The recess filler 40 may be disposed adjacent to the bit line structure 30. For example, the recess filler 40 may be disposed at each of opposite sides of the bit line contact 31. An upper surface of the recess filler 40 may be coplanar with an upper surface of the interlayer insulation layer 20. An inner spacer 41 may be conformally formed to surround a bottom surface of the recess filler 40 and a side surface of the bit line structure 30. In an embodiment, the recess filler 40 may include silicon oxide, silicon nitride, silicon oxynitride, or a combination thereof. The inner spacer 41 may include silicon nitride.

The storage contact 51 may be disposed adjacent to the bit line structure 30 and may partially pass through the upper portion of the substrate 10. The storage contact 51 may contact the drain region D. The contact buffer layer 55 may be disposed on the storage contact 51. The storage contact 51 may include a conductive material such as doped polysilicon. The contact buffer layer 55 may include one of tungsten silicide (W—Si), titanium silicide (Ti—Si), tantalum silicide (Ta—Si), nickel silicide (Ni—Si), cobalt silicide (Co—Si), and various other metal silicides. In an embodiment, the contact buffer layer 55 may include a barrier layer such as TiN.

The bit line spacer 60 may be disposed on a side surface of the bit line structure 30. The bit line spacer 60 may include an inner spacer 61, an outer spacer 63, and a capping spacer 65. The inner spacer 61 may partially surround the side surface of the bit line structure 30, the outer spacer 63 may be disposed outward from the inner spacer 61, and the capping spacer 65 may be disposed on the inner spacer 61 and the outer spacer 63.

The landing pad barrier layer 70 may be conformally formed along an upper surface of the bit line structure 30, a side surface of the capping spacer 65, and an upper surface of the contact buffer layer 55. The landing pad 102 may be disposed on the landing pad barrier layer 70 and may be connected to a plurality of lower electrodes LE. The landing pad barrier layer 70 may include a barrier metal such as TiN, Ti/TiN, TiSiN, TaN, or WN.

The pad insulation layer 104 may be disposed between adjacent landing pads 102 and may electrically insulate a plurality of landing pads 102 from each other. The pad insulation layer 104 may downwardly protrude toward the bit line spacer 60, between the landing pads 102. An upper surface of the pad insulation layer 104 may be coplanar with an upper surface of the landing pad 102. In an embodiment, the pad insulation layer 104 may include silicon oxide, silicon nitride, silicon oxynitride, or a combination thereof.

According to example embodiments of the disclosure, because a lower electrode includes an inner protective layer and an outer protective layer, the bending or collapsing of the lower electrode may be prevented and/or reduced.

Hereinabove, example embodiments of the disclosure have been described with reference to the accompanying drawings, but it will be understood by those skilled in the art that the embodiments may be implemented in another detailed form without departing from the scope of the invention. The embodiments described above are merely examples in all aspects, and the scope of the invention is not limited to these examples.

What is claimed is:

1. A semiconductor device comprising:
a landing pad on a substrate;
a lower electrode on the landing pad, the lower electrode including an outer protective layer, a conductive layer between opposing sidewalls of the outer protective layer, and an inner protective layer between opposing sidewalls of the conductive layer;
a first supporter pattern on a side surface of the lower electrode, the first supporter pattern including a supporter hole;
a first metal layer between the conductive layer and the first supporter pattern;
a dielectric layer on a surface of each of the lower electrode and the first supporter pattern; and
an upper electrode on the dielectric layer,
wherein an upper end of the outer protective layer is at a higher level than an upper surface of the conductive layer,
wherein the outer protective layer includes titanium oxide, the conductive layer includes titanium nitride, and the inner protective layer includes titanium silicon nitride,
wherein, in a horizontal cross-sectional view, the outer protective layer has an arc shape that extends between the dielectric layer and the conductive layer, and
wherein the first metal layer overlaps the outer protective layer in a vertical direction.

2. The semiconductor device of claim 1,
wherein the lower electrode further includes a lower metal layer between the landing pad and the conductive layer, and
wherein the lower metal layer is at least as wide as a bottom surface of the conductive layer.

3. The semiconductor device of claim 1, wherein the outer protective layer includes a protrusion protruding in a vertical direction, and an upper end of the protrusion is at a higher level than the upper surface of the conductive layer.

4. The semiconductor device of claim 1, wherein, in the horizontal cross-sectional view, at least a portion of the outer protective layer contacts the first supporter pattern.

5. The semiconductor device of claim 1, wherein an upper surface of the first metal layer is lower than an upper surface of the first supporter pattern.

6. The semiconductor device of claim 1, wherein the first metal layer includes titanium.

7. The semiconductor device of claim 1,
wherein, in the horizontal cross-sectional view, the first metal layer has an arc shape, and
wherein, in the horizontal cross-sectional view, the outer protective layer and the first metal layer together surround the conductive layer.

8. The semiconductor device of claim 1, wherein a bottom surface of the first metal layer is at a higher level than a bottom surface of the first supporter pattern.

9. The semiconductor device of claim 1, wherein the outer protective layer includes:
a first outer protective layer that is on a side surface and a bottom surface of the conductive layer; and
a second outer protective layer that is on a side surface of the first outer protective layer.

10. The semiconductor device of claim 9, wherein the second outer protective layer is on an upper surface of the first outer protective layer.

11. The semiconductor device of claim 9,
wherein the lower electrode further includes a metal layer between the conductive layer and the first supporter pattern, and
wherein the metal layer protrudes in a horizontal direction from the side surface of the first outer protective layer and contacts the first supporter pattern.

12. The semiconductor device of claim 1,
wherein the conductive layer includes a first conductive layer and a second conductive layer that is between opposing sidewalls of the first conductive layer, and
wherein the inner protective layer includes:
a first inner protective layer that is between the first conductive layer and the second conductive layer; and
a second inner protective layer that is between opposing sidewalls of the second conductive layer.

13. A semiconductor device comprising:
a landing pad on a substrate;
a lower electrode structure including a first lower electrode on the landing pad and a second lower electrode on the first lower electrode;
a buried layer between the first lower electrode and the second lower electrode;
a first supporter pattern on a side surface of the lower electrode structure, the first supporter pattern including a supporter hole;
a dielectric layer on a surface of each of the lower electrode structure and the first supporter pattern; and
an upper electrode on the dielectric layer,
wherein the first lower electrode includes a first outer protective layer, a first conductive layer between opposing sidewalls of the first outer protective layer, and a first inner protective layer between opposing sidewalls of the first conductive layer,
wherein the second lower electrode includes a second outer protective layer, a second conductive layer between opposing sidewalls of the second outer protective layer, and a second inner protective layer between opposing sidewalls of the second conductive layer, and
wherein each of the first outer protective layer and the second outer protective layer comprises titanium oxide, each of the first conductive layer and the second conductive layer includes titanium nitride, and each of the first inner protective layer and the second inner protective layer includes titanium silicon nitride.

14. The semiconductor device of claim 13,
wherein a bottom surface of the buried layer contacts an upper surface of each of the first conductive layer and the first inner protective layer, and
wherein an upper surface of the buried layer contacts a bottom surface of the second conductive layer.

15. The semiconductor device of claim 13, wherein the buried layer includes titanium.

16. A semiconductor device comprising:
a landing pad on a substrate;
a lower electrode on the landing pad, the lower electrode including an outer protective layer, a conductive layer having a U-shaped cross-sectional surface between opposing sidewalls of the outer protective layer, and an inner protective layer between opposing sidewalls of the U-shaped cross-sectional surface of the conductive layer;
a first supporter pattern on a side surface of the lower electrode, the first supporter pattern including a supporter hole;
a first metal layer between the conductive layer and the first supporter pattern, the first metal layer overlapping the outer protective layer in a vertical direction and including an upper surface at a lower level than an upper surface of the first supporter pattern;
a dielectric layer on a surface of each of the lower electrode and the first supporter pattern; and
an upper electrode on the dielectric layer,
wherein the outer protective layer includes titanium oxide, the conductive layer includes titanium nitride, and the inner protective layer includes titanium silicon nitride, and
wherein, in a horizontal cross-sectional view, the outer protective layer and the first metal layer each have an arc shape and together surround the conductive layer.

* * * * *